(12) United States Patent
Itoh

(10) Patent No.: US 9,680,076 B2
(45) Date of Patent: Jun. 13, 2017

(54) LIGHT-EMITTING DEVICE, ILLUMINATION DEVICE AND BACKLIGHT FOR DISPLAY DEVICE

(71) Applicant: SHARP KABUSHIKI KAISHA, Osaka-shi, Osaka (JP)

(72) Inventor: Shin Itoh, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/410,469

(22) PCT Filed: May 15, 2013

(86) PCT No.: PCT/JP2013/063481
§ 371 (c)(1),
(2) Date: Dec. 22, 2014

(87) PCT Pub. No.: WO2014/002628
PCT Pub. Date: Jan. 3, 2014

(65) Prior Publication Data
US 2015/0340576 A1    Nov. 26, 2015

(30) Foreign Application Priority Data

Jun. 29, 2012 (JP) ................................. 2012-147826

(51) Int. Cl.
*H01L 33/60* (2010.01)
*F21V 8/00* (2006.01)
(Continued)

(52) U.S. Cl.
CPC ............ *H01L 33/60* (2013.01); *G02B 6/0031* (2013.01); *H01L 25/0753* (2013.01);
(Continued)

(58) Field of Classification Search
CPC ....... H01L 33/486; H01L 33/62; H01L 24/49; H01L 25/0753; H01L 2924/00014;
(Continued)

(56) References Cited

U.S. PATENT DOCUMENTS

2004/0218390 A1* 11/2004 Holman ................ G02B 5/045
362/245
2008/0048201 A1 2/2008 Kim et al.
(Continued)

FOREIGN PATENT DOCUMENTS

JP    2001-203393    7/2001
JP    2008-053726    3/2008
(Continued)

OTHER PUBLICATIONS

International Search Report for PCT/JP2013/063481, mailed Jun. 11, 2013.

*Primary Examiner* — Anh Mai
*Assistant Examiner* — Fatima Farokhrooz
(74) *Attorney, Agent, or Firm* — Nixon & Vanderhye P.C.

(57) ABSTRACT

An LED chip (3) is disposed in a recessed portion (21p) formed by bending a metal lead frame (2). A reflector (4) has a resin reflection surface (4a) and the recessed portion (21p) has a metal reflection surface (21a). When the inclination angle of at least one metal reflection surface (21a) is $\theta s2(°)$, the resin reflection surface (4a) has a sloped resin surface with an inclination angle of $\theta s1(°)$ that is smaller than $\theta s2(°)$. With $\theta c(°)$ defined as the critical angle of light emitted from an LED chip (3) and incident on the interface between a light-transmissive resin (5) and an air layer, the sloped resin surface and metal reflection surface having a relationship of $\theta s1<\theta s2$, satisfies both a conditional expression (1): $45°-\theta c/2<\theta s1<\theta c$ and a conditional expression (2): $35°\leq \theta s2 \leq 55°$.

28 Claims, 30 Drawing Sheets

H1 < H2
H3 < H2

(51) Int. Cl.
*H01L 33/62* (2010.01)
*H01L 33/50* (2010.01)
*H01L 25/075* (2006.01)

(52) U.S. Cl.
CPC .............. *H01L 33/50* (2013.01); *H01L 33/62* (2013.01); *G02B 6/0073* (2013.01); *H01L 2224/48091* (2013.01); *H01L 2224/48137* (2013.01)

(58) Field of Classification Search
CPC ............. H01L 33/64; H01L 2933/0033; H01L 2224/48247; H01L 2224/48091; H01L 2224/48137; H01L 25/167; H01L 2924/12035; H01L 2924/12041; H01L 2924/01322; H01L 2924/12032; H01L 2224/48465; H01L 2224/48471; H01L 2224/4945; H01L 33/60; H01L 33/50; H01L 25/07; G02B 6/0031
See application file for complete search history.

(56) References Cited

U.S. PATENT DOCUMENTS

| | | | |
|---|---|---|---|
| 2011/0175119 A1* | 7/2011 | Kim | H01L 33/483 257/91 |
| 2011/0220927 A1 | 9/2011 | Min | |
| 2012/0262941 A1 | 10/2012 | Min | |
| 2012/0326183 A1 | 12/2012 | Min | |
| 2013/0299854 A1* | 11/2013 | Lee | H01L 33/62 257/88 |
| 2014/0211500 A1 | 7/2014 | Min | |
| 2014/0225134 A1 | 8/2014 | Min | |

FOREIGN PATENT DOCUMENTS

| | | | |
|---|---|---|---|
| JP | 2010-062427 | | 3/2010 |
| JP | 2011-146709 | | 7/2011 |
| JP | 2011146712 | * | 7/2011 |
| JP | 2011-254080 | | 12/2011 |

* cited by examiner $\theta c \leqq \theta t < \theta 0$

LAMBERTIAN RADIATION

UNIFORM RADIATION FROM LIGHT SOURCE $$\Delta \theta = 2(\theta s2 - \theta) < 0°$$

$$\Delta \theta = 2(\theta s2 - \theta) > 0°$$

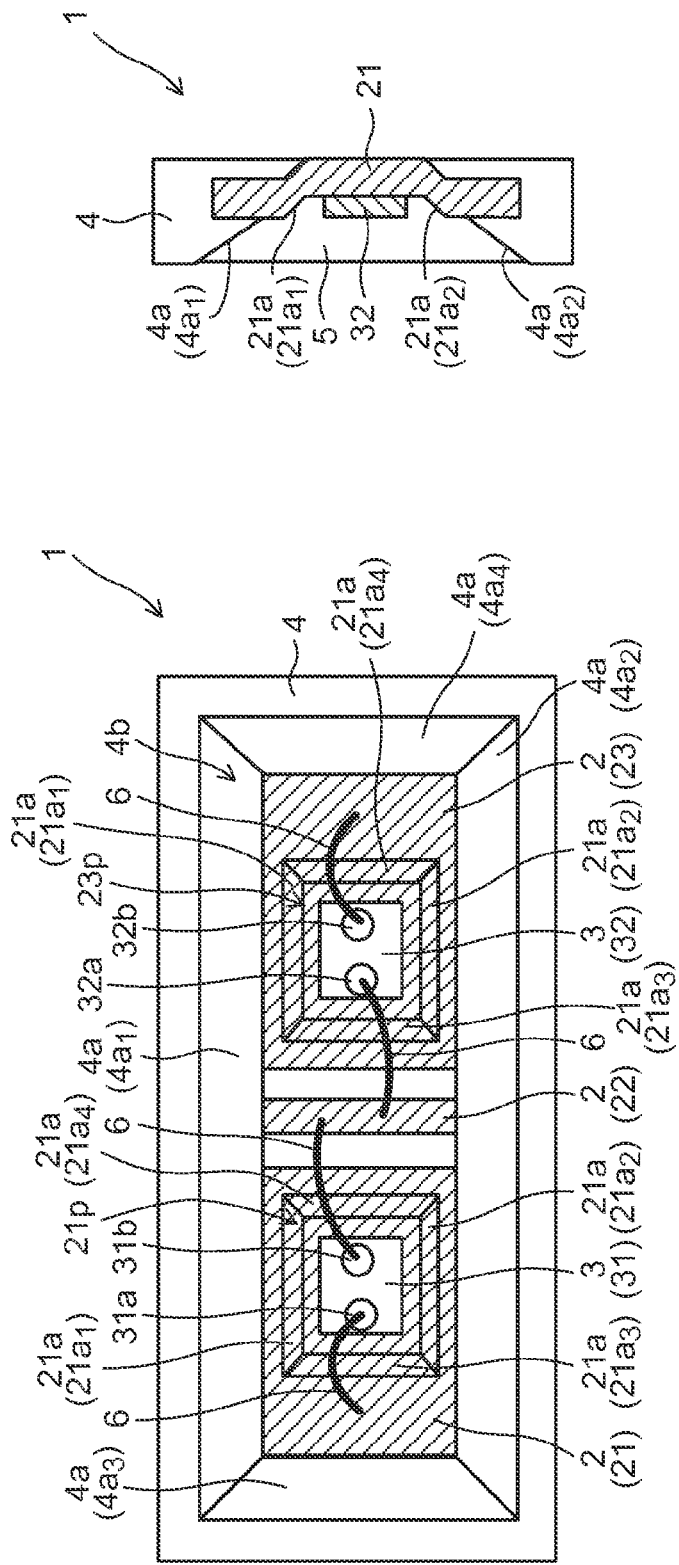

LIGHT-EMITTING DEVICE, ILLUMINATION DEVICE AND BACKLIGHT FOR DISPLAY DEVICE

This application is the U.S. national phase of International Application No. PCT/JP2013/063481, filed May 15, 2013, which designated the U.S. and claims priority to JP Application No. 2012-147826, filed Jun. 29, 2012, the entire contents of each of which are hereby incorporated by reference.

TECHNICAL FIELD

The present invention relates to a light-emitting device having a light-emitting element such as an LED (light-emitting diode), and to an illumination device and a backlight for a display device, each provided with such a light-emitting device.

BACKGROUND ART

A conventional light-emitting device provided with an LED is disclosed, for example, in Patent Document 1 identified below. In this light-emitting device, an LED is embedded in a molding (reflector) which has formed thereon a first reflective face which is increasingly wide open from the bottom face of the molding upward and a second reflective face which is contiguous with the first reflective face and is increasingly wide open further upward, and the LED is sealed in resin from around. The inclination angle of the second reflective face is so set as to be larger than 0° but smaller than the critical angle at the interface between the resin and the layer of air. With the inclination angle of the second reflective face so set, more of the light that is totally reflected on the interface, is then totally reflected on the second reflective face, and is then incident on the interface again can be extracted, achieving improved light extraction efficiency.

However, in the structure according to Patent Document 1, the first reflective face (inner wall) of the molding is located close beside the LED, and the light emergent from the LED is incident on the inner wall directly (across a short distance). This may discolor the inner wall and shorten the lifetime of the package. In particular, in a case where a high-luminance blue LED is used and the molding is formed of white resin with high reflectance, the white resin turns increasingly yellow, which significantly lowers the light output of the package and significantly shortens the lifetime of the package.

As an improvement, in the light-emitting device according to Patent Document 2 identified below, a metal lead frame is bent to form a recess, which is surrounded by a reflector, and an LED is arranged on the bottom face of the recess and is sealed in transparent resin. In this structure, the light emergent from the LED is reflected on the side face of the recess, and this reduces the light that is directly incident on the inner wall of the reflector. It is thus possible to alleviate discoloration of the inner wall and to prolong the lifetime of the package.

Patent Document 2 also discloses a structure in which an LED is arranged on one of a plurality of metal lead frames arranged apart from one another and the electrodes of different polarities of the LED are electrically connected to different ones of the metal lead frames via bonding wires respectively, wherein the metal lead frames each have a fin portion formed integrally therewith. The fin portion is provided at opposite sides of a bottom portion of each metal lead frame, with an inclination relative to the bottom portion, so as to form reflective faces. Also with this structure where the light from the LED arranged in the bottom portion of the metal lead frame is reflected on the fin portion, it is possible to reduce the amount of light that is directly incident on the inner wall of the reflector and to alleviate discoloration of the inner wall.

LIST OF CITATIONS

Patent Literature

Patent Document 1: JP-A-2010-62427 (claim 1, paragraphs [0018] and [0019], FIGS. 1 and 2, etc.)
Patent Document 2: JP-A-2008-53726 (paragraphs [0009], [0026], and [0037], FIGS. 5 and 8, etc.)

SUMMARY OF THE INVENTION

Technical Problem

However, Patent Document 2 discloses nothing about the range of the inclination angle of the reflective faces provided at the side of the LED. Thus, depending on the inclination angle of the reflective faces, it can occur that, when the light emergent sideways from the LED is incident, via those reflective faces, on the interface between the resin in which the LED is sealed and the layer of air, a higher proportion of the light is reflected there, making it impossible to efficiently extract the light incident on the interface.

On the other hand, in the light-emitting device according to Patent Document 1, the range of the inclination angle of the second reflective face is so wide that it cannot necessarily be said that a satisfactorily improvement in light extraction efficiency is achieved there. For example, as the inclination angle of the second reflective face approaches 0°, the closer to 90° the angle of incidence of the light incident on the interface between the resin and the layer of air, the more likely the light that is totally reflected on the interface, is then reflected on the second reflective face, and is then incident on the interface again is totally reflected there, leading to lower light extraction efficiency.

Against the background discussed above, an object of the present invention is to provide a light-emitting device that can satisfactorily improve the efficiency of extraction of the light emitted from a light-emitting element to outside while suppressing discoloration of an inner wall of a package, and to provide an illumination device and a backlight for a display device, each provided with such a light-emitting device.

Means for Solving the Problem

According to one aspect of the present invention, a light-emitting device is provided with: a light-emitting element arranged on one of a plurality of metal lead frames arranged apart from one another; and a reflector arranged so as to surround the plurality of metal lead frames together and formed of a light-reflecting resin. The light-emitting element has electrodes of different polarities electrically connected respectively to different ones of the metal lead frames, and the light-emitting element is located inside the reflector and sealed in a light-transmitting resin. In this light-emitting device, the light-emitting element is arranged inside a recess formed by bending the metal lead frame. The reflector has a resin reflective face located outside the recess in the metal lead frame and inclined relative to a bottom face of the recess. The recess in the metal lead frame has, as metal reflective faces, a plurality of side faces inclined relative to the bottom face. When the inclination angle of at least one of the metal reflective faces relative to the bottom face equals $\theta s2$ (°), then the resin reflective face has a resin inclined face inclined relative to the bottom face at an inclination angle $\theta s1$ (°) smaller than the inclination angle $\theta s2$. When the critical angle of the light emergent from the light-emitting element and incident on the interface between the light-transmitting resin and the layer of air equals $\theta c$ (°), then, for any of the resin inclined face and the metal reflective faces that fulfill $\theta s1 < \theta s2$, formulae (1) and (2) below are simultaneously fulfilled:

$$45° - \theta c/2 < \theta s1 < \theta c, \quad (1)$$

$$35° \leq \theta s2 \leq 55°. \quad (2)$$

According to another aspect of the present invention, an illumination device is provided with a light-emitting device as described above for illuminating an illumination target.

According to yet another aspect of the present invention, a backlight for a display device is provided with: a light-emitting device as described above; and a light guide plate for guiding therethrough the light from the light-emitting device to illuminate a liquid crystal display panel.

Advantageous Effects of the Invention

According to the present invention, it is possible, by arranging a light-emitting element inside a recess in a metal lead frame, to suppress discoloration of an inner wall of a reflector and prolong the lifetime of a device, and simultaneously, by fulfilling formulae (1) and (2), to satisfactorily improve the efficiency of light extraction to outside.

BRIEF DESCRIPTION OF DRAWINGS

FIG. 33C is a sectional view of the LED package across a sectional plane perpendicular to the longer-side direction thereof;

FIG. 34A is a plan view showing still another structure of the LED package;

DESCRIPTION OF EMBODIMENTS

Figure 1A:
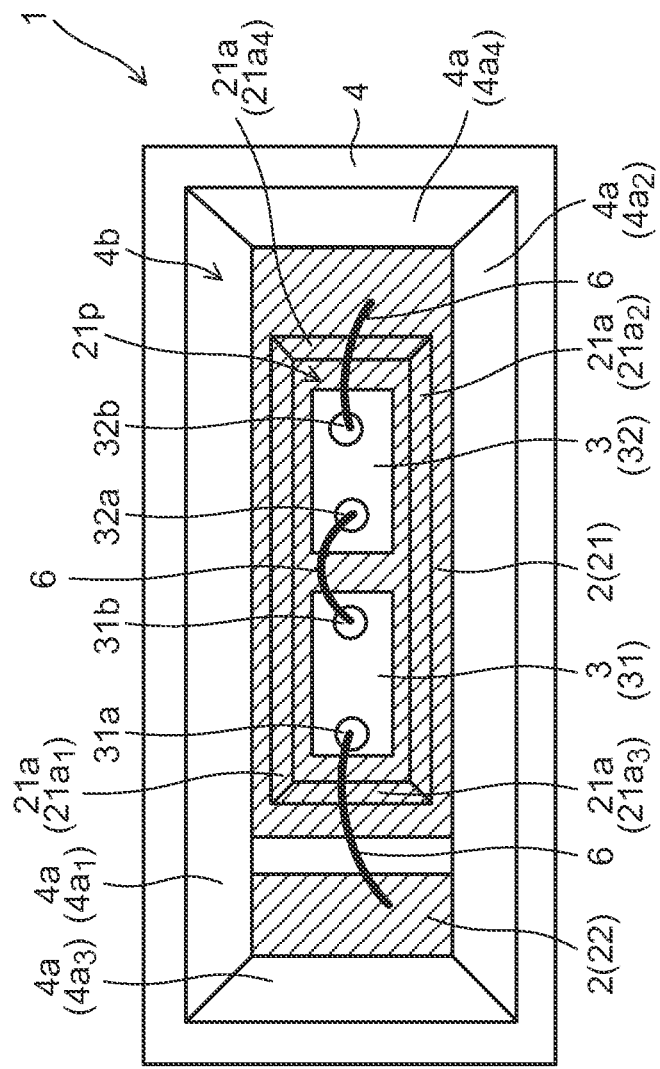
FIG. 1A is a plan view of an LED package as a light-emitting device according to one embodiment of the present invention.

Embodiments of the present invention will be described below with reference to the accompanying drawings. It should be noted that, in the drawings, leads (exterior leads, outer leads) necessary for electrical connection with a mounting circuit board are omitted from illustration.

[Structure of a Light-Emitting Device]

Figure 1B:
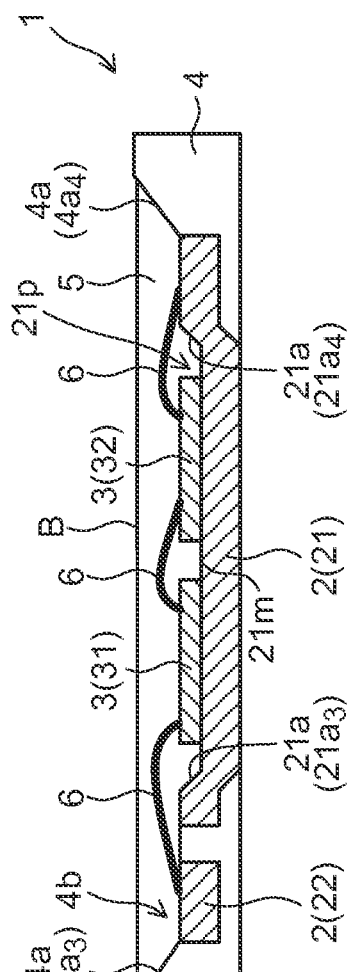
FIG. 1B is a sectional view of the LED package across a sectional plane perpendicular to the shorter-side thereof.
Figure 1C:
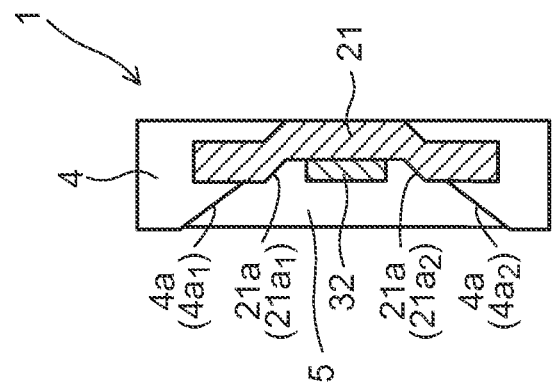
FIG. 1C is a sectional view of the LED package across a sectional plane perpendicular to the longer-side thereof.

FIG. 1A is a plan view of an LED package 1 as a light-emitting device according to one embodiment of the present invention, FIG. 1B is a sectional view of the LED package 1 across a sectional plane perpendicular to the shorter-side direction thereof, and FIG. 1C is a sectional view of the LED package 1 across a sectional plane perpendicular to the longer-side direction thereof. In the plan view in FIG. 1A, to clarify the region of a later-described metal lead frame 2, the region is indicated, for convenience' sake, by the same hatching as in the sectional view (the same applies to other similar plan views).

The LED package 1 is rectangular as seen in a plan view, and is structured as follows: an LED chip 3 as a light-emitting element is arranged on a metal lead frame 2; the metal lead frame 2 is surrounded by a reflector 4; the LED chip 3 located inside (an opening 4b of) the reflector 4 is sealed in with light-transmitting resin 5. In the following description, the directions along the longer sides and along the shorter sides of the LED package 1 are also referred to simply as the longer-side direction (the left/right direction in FIG. 1A) and the shorter-side direction (the up/down direction in FIG. 1A) respectively.

The metal lead frame 2 comprises two metal lead frames 21 and 22 which are arranged apart from each other in the longer-side direction and which are electrically connected to an external power supply. These metal lead frames 21 and 22 are together surrounded by the reflector 4. The LED chip 3 is arranged on one metal lead frame 21. In the embodiment, the LED chip 3 comprises two LED chips 31 and 32 which are arranged, side by side in the longer-side direction, inside a recess 21p formed by bending the metal lead frame 21.

The recess 21p has, as a metal reflective face 21a, a side face which is inclined relative to a bottom face 21m on which the LED chip 3 is arranged inside the recess 21p. The metal reflective face 21a comprises, on one hand, two metal reflective faces $21a_1$ and $21a_2$ that are located opposite each other across the bottom face 21m and that are located along the longer-side direction and, on the other hand, two metal reflective faces $21a_3$ and $21a_4$ that are located opposite each other across the bottom face 21m and that are located along the shorter-side direction. The depth of the recess 21p is greater than the thickness of the LED chips 31 and 32.

The LED chips 31 and 32 each comprise a light-emitting diode that emits blue light. On the other hand, the light-transmitting resin 5, in which the LED chip 3 is sealed, contains a yellow phosphor (phosphorescent or fluorescent substance) that absorbs blue light and emits yellow light. Thus, the LED package 1 as a whole can, by mixing the blue and yellow light, emit white light. Adding the yellow phosphor to the light-transmitting resin 5 makes it possible to use a high-luminance blue LED chip 3 as a light-emitting element, and thus to realize an LED package 1 that is suitable, as will be described later, as a backlight for a liquid crystal display device and as an illumination device for indoor illumination.

On the top face of the LED chip 31, a first electrode 31a and a second electrode 31b of different polarities are formed. Likewise, on the top face of the LED chip 32, a first electrode 32a and a second electrode 32b of different polarities are formed. Here, the first electrodes 31a and 32a can each be one of an anode electrode and a cathode electrode, and the second electrodes 31b and 32b can each be the other of an anode electrode and a cathode electrode. The first electrode 31a of the LED chip 31 is connected to the metal lead frame 22 by a metal lead 6, and the second electrode 31b of the LED chip 31 is connected to the first electrode 32a of the LED chip 32 by a metal lead 6. The second electrode 32b of the LED chip 32 is connected to the metal lead frame 21 by a metal lead 6. Thus, the electrodes of different polarities of the LED chip 31 are electrically connected to different metal lead frames, each at least via a metal lead. Likewise, the electrodes of different polarities of the LED chip 32 are electrically connected to different metal lead frames, each at least via a metal lead.

The reflector 4 is formed of white or whitish resin that is light-reflecting resin, and has a resin reflective face 4a which is located outside the recess 21p in the metal lead frame 21 and which is inclined relative to a bottom face 21m of the recess 21p. Here, when the inclination angle of at least one of the above-mentioned four metal reflective faces $21a_1$ to $21a_4$ relative to the bottom face 21m is represented by θs2 (°), then the resin reflective face 4a has a resin inclined face that is inclined at an inclination angle θs1 (°) smaller than the inclination angle θs2 relative to the bottom face 21m. More specifically, the resin reflective face 4a comprises, on one hand, two resin inclined faces $4a_1$ and $4a_2$ that are located opposite each other across the recess 21p and that are located in the longer-side direction and, on the other hand, two resin inclined faces $4a_3$ and $4a_4$ that are located opposite each other across the recess 21p and that are located in the shorter-side direction. The space surrounded by these four resin inclined faces $4a_1$ to $4a_4$ forms the opening 4b in the reflector 4, and this opening 4b is filled with the light-transmitting resin 5.

[Inclination Angle of the Resin Inclined Face]

In the embodiment, when the critical angle of the light emergent from the LED chip 3 and incident on the interface B between the light-transmitting resin 5 and the layer of air is represented by θc (°), then with respect to a resin inclined face and a metal reflective face that fulfill the relationship θs1<θs2, formula (1) below holds:

$$45° - \theta c/2 < \theta s1 < \theta c. \quad (1)$$

Here, with respect to light traveling out of the light-transmitting resin 5 into a medium different from it (which can be air or a gas other than air), when the index of refraction of the light-transmitting resin 5 is represented by n and the index of refraction of the medium is represented by n0, then the critical angle θc is given by $$\theta c = \sin^{-1}(n0/n).$$

In particular, when the medium is air, assuming that n0=1, the critical angle θc is given by $$\theta c = \sin^{-1}(1/n).$$

The factors underlying formula (1) above will be discussed below, where, for convenience' sake, the inclination of the resin inclined faces $4a_1$ to $4a_4$ will be discussed together as the inclination of the resin reflective face 4a.

Figure 2:
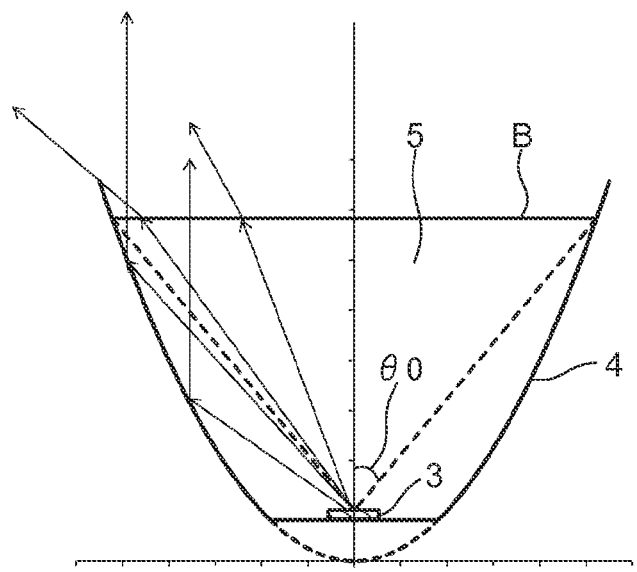
FIG. 2 is a diagram illustrating an example of the shape of a reflector for reflecting light from an LED chip.
Figure 3:
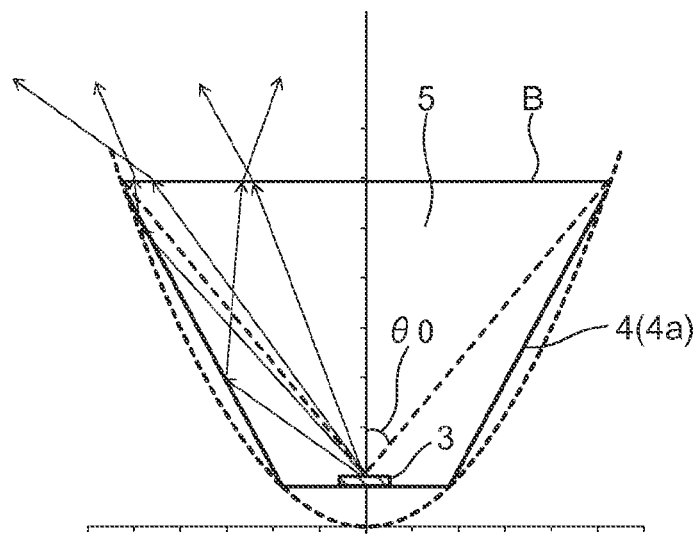
FIG. 3 is a diagram illustrating another example of the shape of the reflector.

FIGS. 2 and 3 are diagrams illustrating the results of simulations done with respect to the shape of the reflector 4. Here, it is assumed that the reflective face of the reflector 4 is parabolic in shape, and that the center of the top face of the LED chip 3 is located at the focus of the parabola. It is also assumed that the light that is emergent from the center of the top face of the LED chip 3 and is then incident on the intersection between the reflective face of the reflector 4 and the interface B between the light-transmitting resin 5 and the layer of air forms an angle θ0 (°) relative to the axis perpendicular to the top face of the LED chip 3.

With a deep reflector 4 such that θ0<θc as shown in FIG. 2, the light emergent from the top face of the LED chip 3 either is directly incident on the interface B and is extracted to outside (into the atmosphere), or is first reflected on the reflective face of the reflector 4 and is then extracted to outside through the interface B. Thus, with this structure, light can be extracted satisfactorily.

Figure 4:
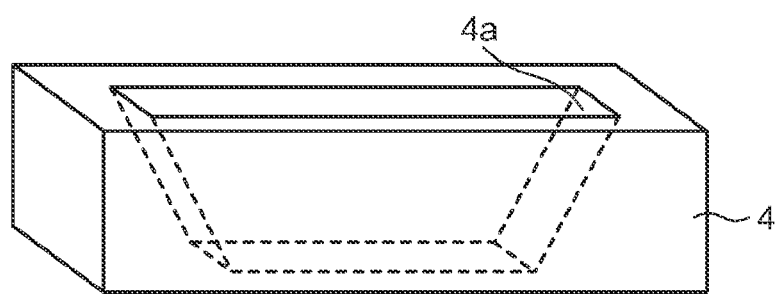
FIG. 4 is a perspective view showing the exterior appearance of the reflector in FIG. 3.

Here, in a case where the reflector 4 is designed as a resin reflector containing a white reflective substance, as shown in FIG. 3, a steep inclined face can be substituted for the resin reflective face 4a of the reflector 4 to achieve fairly satisfactory extraction of light. FIG. 4 is a perspective view schematically showing the exterior appearance of a reflector 4 having a steep inclined face as the resin reflective face 4a. This type of reflector 4 can be used in light-emitting devices of a side-view type for backlights in medium- and small-size liquid crystal panels.

Figure 5:
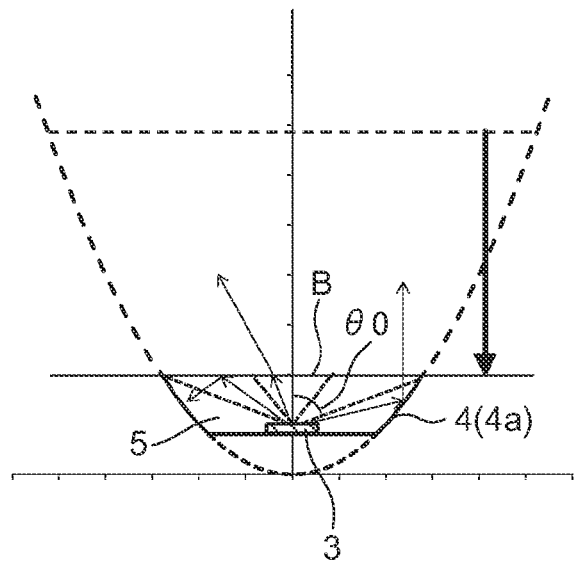
FIG. 5 is a diagram illustrating yet another example of the shape of the reflector and schematically showing how light travels when the reflector is used.
Figure 6:
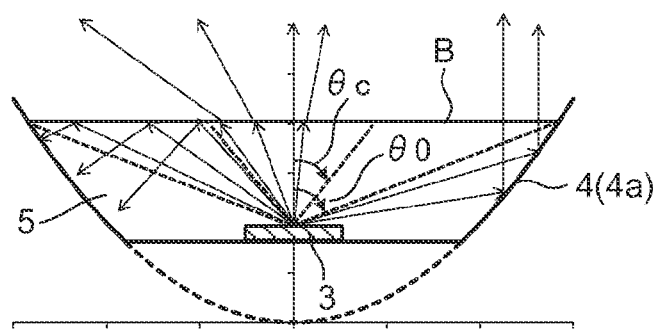
FIG. 6 is a diagram illustrating the reflector in FIG. 5 on an enlarged scale.

On the other hand, FIG. 5 is a diagram schematically illustrating how light travels when a shallow reflector 4 is used to cope with a flat package, and FIG. 6 is a diagram illustrating the reflector 4 shown in FIG. 5 on an enlarged scale. With a shallow reflector 4 such that θ0>θc, a structure similar to one for a deep reflector 4 does not achieve as satisfactory light extraction. The reasons will be clarified below.

For easy understanding, in the following discussion, with respect to a shallow reflector 4 such that θ0>θc, the light emergent from the center of the top face of the LED chip 3 will be divided into three parts (a), (b), and (c) as noted below, which will be studied separately. It is assumed that the angle of the light emergent from the center of the top face of the LED chip 3 relative to the axis perpendicular to the top face of the LED chip 3 equals θt(°).

(a) Light Emergent at Angles in the Range θc≤θt<θ0

Figure 7:
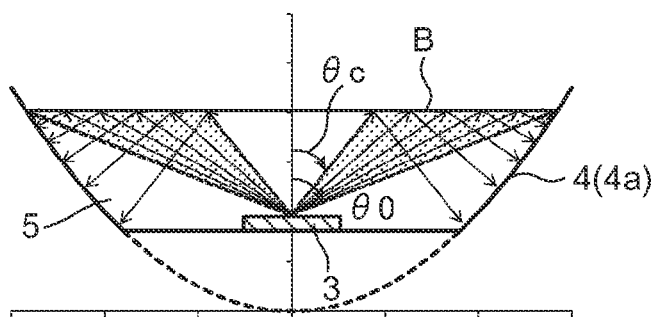
FIG. 7 is a diagram illustrating how light emergent from an LED chip at angles in a predetermined range travels.

FIG. 7 is a diagram illustrating the path of the light emergent from the LED chip 3 in the range of angles (a). In this range of angles, light is totally reflected on the interface B between the light-transmitting resin 5 and the layer of air and is confined inside the package, and part of the light becomes stray light inside the package and is eventually absorbed.

(b) Light Emergent at Angles in the Range 0°≤θt<θc

Figure 8:
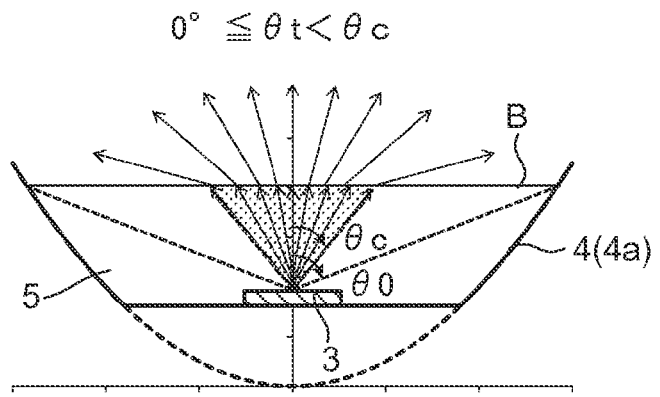
FIG. 8 is a diagram illustrating how light emergent at angles in a different range than mentioned above travels.

FIG. 8 is a diagram illustrating the path of the light emergent from the LED chip 3 in the range of angles (b). In this range of angles, all the light emergent from the LED chip 3 is extracted into the layer of air without being totally reflected at the interface B.

(c) Light Emergent at Angles in the Range θ0≤θt<90°

Figure 9:
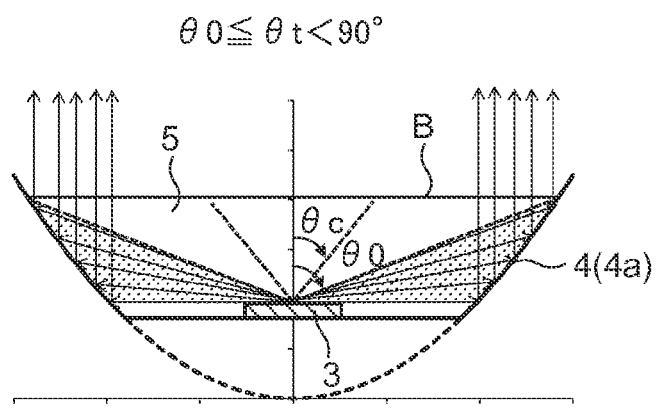
FIG. 9 is a diagram illustrating how light emergent at angles in a still different range than mentioned above travels.

FIG. 9 is a diagram illustrating the path of the light emergent from the LED chip 3 in the range of angles (c). In this range of angles, the light emergent from the LED chip 3 is first reflected on the reflector 4 and is then extracted to outside through the interface B.

Thus, of the light emergent from the top face of the LED chip 3, the part in the range of angles (a) cannot be extracted out of the package, and this constitutes a factor that lowers the efficiently of light extraction out of the package. Accordingly, it is necessary to work out a design that allows efficient extraction of such light.

Moreover, even though, as shown in FIG. 8, the light emergent from the LED chip 3 at angles in the range (b) 0°≤θt<θc is directly extracted into the layer of air through the interface B, this light constitutes a very small proportion. This makes all the more important a design that allows efficient extraction of the light that is confined inside the package by total reflection on the interface B. This will now be elaborated on.

Figure 10:
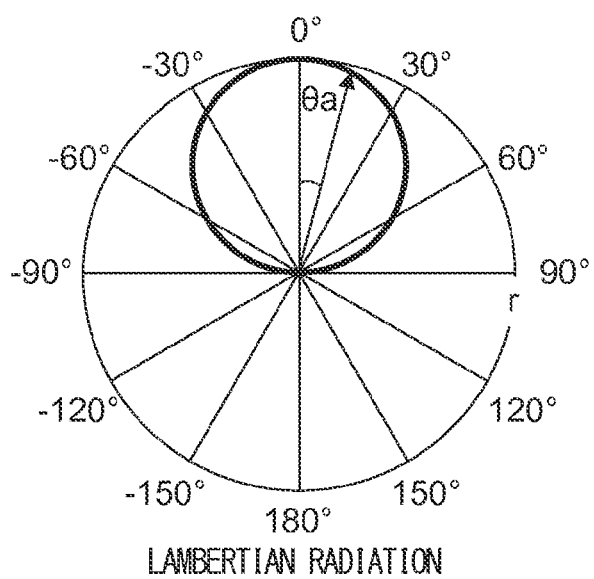
FIG. 10 is a diagram illustrating a light distribution pattern in light emission from the top face of a blue LED.
Figure 11:
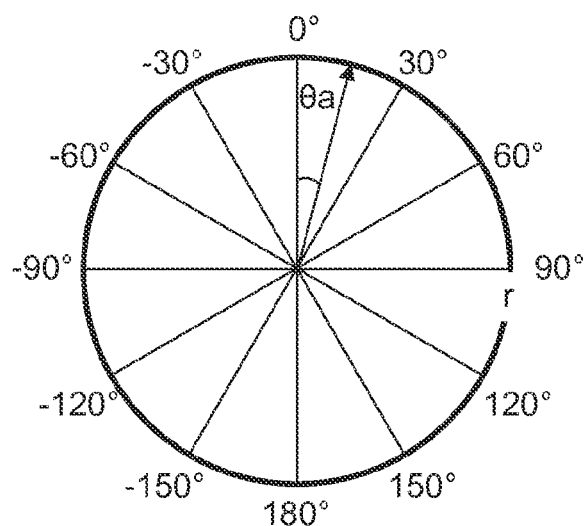
FIG. 11 is a diagram illustrating a light distribution pattern in light emission by a phosphor.

FIG. 10 is a diagram illustrating a light distribution pattern in light emission from the top face of a junction-up blue LED that emits blue light. The light distribution pattern of a blue LED is often approximated, as indicated by a thick solid line in FIG. 10, a Lambertian light distribution pattern. FIG. 11 is a diagram illustrating a light distribution pattern in light emission by a phosphor. The light distribution pattern of a phosphor is, as indicated by a thick solid line in FIG. 11, a pattern that is uniform in the circumferential direction. In the polar coordinate system with a radius r shown in FIGS. 10 and 11, the radiation intensity of the blue LED is represented by r·cos θa, and the radiation intensity of the phosphor is represented by r.

Figure 12:
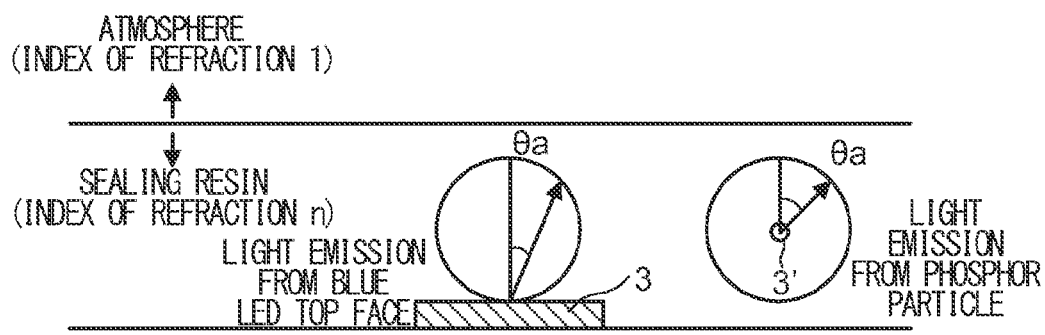
FIG. 12 is a diagram illustrating a light distribution pattern of a light source sealed in resin.

FIG. 12 shows the light distribution patterns of light sources (an LED chip 3 and a phosphor 3') flat-sealed in resin (with an index of refraction n) extending infinitely in two-dimensional directions. As shown there, the light distribution patterns of the LED chip 3 and the phosphor 3' can be considered similar to those shown in FIGS. 10 and 11 respectively.

Studied next will be the proportion, in the light emergent from an LED chip 3 and a phosphor 3' as mentioned above, of the light that directly exits from the sealing resin into the atmosphere. A simplified estimation based on Snell's law gives the proportion of light that directly exits into the atmosphere in the light emitted inside sealing resin with an index of refraction n as follows:

For Lambertian radiation,$(1-\cos(2·\theta c))/2 \times 100(\%)$; and    (A)

For even radiation,$(1-\cos \theta c)/2 \times 100(\%)$.    (B)

Needless to say, in deriving the above proportion, consideration is also given to the azimuth (0° to 360°) about the vertical axis. Here, θc represents the critical angle of the light that travels out of the sealing resin into the atmosphere. Thus, when it is assumed that the index of refraction of the sealing resin equals n, and that the index of refraction of the atmosphere equals 1, then $\theta c = \sin^{-1}(1/n)$.

Figure 13:
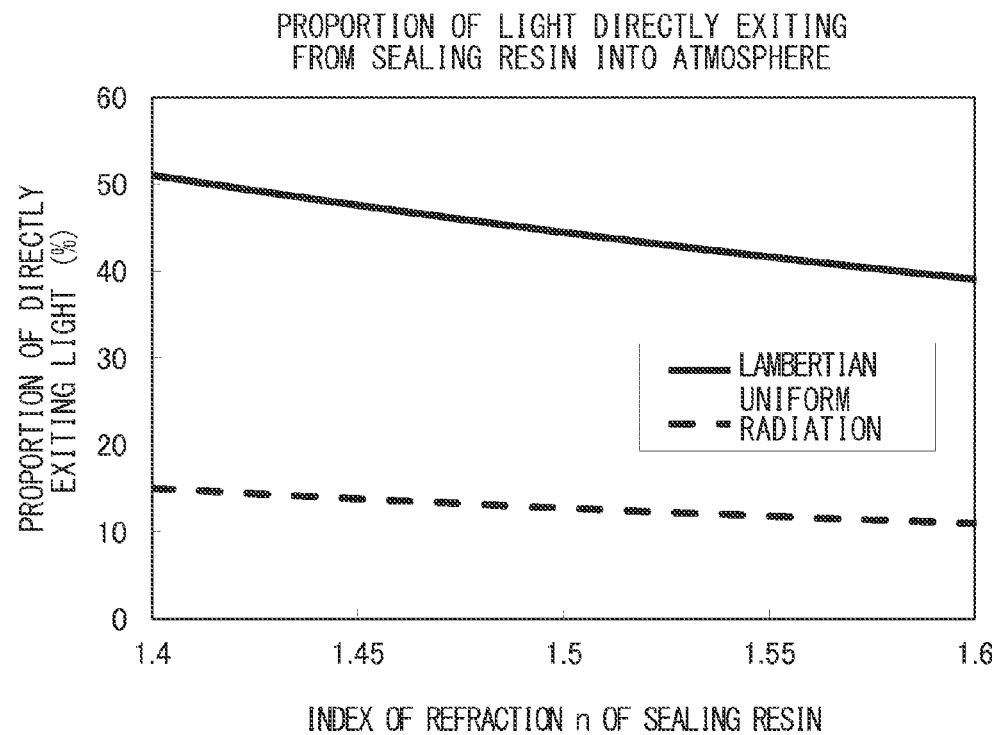
FIG. 13 shows plots of the proportion of light that can exit from sealing resin directly into the atmosphere.

FIG. 13 show plots, for Lambertian and uniform radiation respectively, of the proportion of the light that directly exits from the sealing resin into the atmosphere against the index of refraction n of the sealing resin ranging from 1.4 to 1.6. For example, with a sealing resin with an index of refraction of 1.5, the proportion of light that directly exits into the atmosphere is, for Lambertian radiation, less than 45% and, for uniform radiation, less than 13%. Thus, the proportion of the light that directly exits from the sealing resin into the atmosphere is, at best, less than 50% in ideal light emission by an LED chip and less than 15% in light emission by a phosphor.

The foregoing reveals that, in a low-profile package using a shallow reflector 4 such that θ0>θc, a larger proportion of the light emergent from an LED is totally reflected back at the interface between the sealing resin and the layer of air. This makes essential an optical design that allows efficient extraction of the totally reflected light.

The discussion thus far has been on light extraction efficiency as considered in a simple system taken as an example where a light source (LED chip 3) is arranged at the focus of a parabola and sealed in resin. In such a simple system, the light emergent from a light source can be divided into three parts (a) to (c) as noted above for the purposes of studying.

On the other hand, in more complex systems, as in cases where a light source is arranged off a central part of a package or a plurality of light sources are arranged, or where a phosphor is added to the resin sealing a light source, a generalized study of an improvement in the efficiency of light extraction out of a low-profile package only requires division into two parts as noted below. Here, it is assumed that the angle of incidence at which the light emergent from the LED chip 3 is incident on the interface B between the light-transmitting resin 5 and the layer of air equals θ (°).

(d) Light Incident on the Interface B at Angles in the Range θ≥θc

Figure 14:
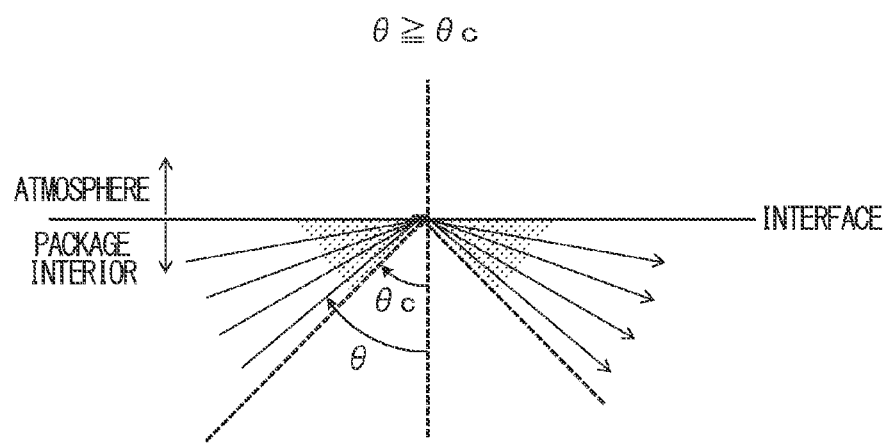
FIG. 14 is a diagram illustrating how light emergent from an LED chip and incident on an interface between light-transmitting resin and a layer of air at angles in a predetermined range travels.

FIG. 14 is a diagram illustrating the path of the light emergent from the LED chip 3 and incident on the interface B at angles in the range (d). In this range of angles, the light emergent from the LED chip 3 is totally reflected on the interface B and is confined inside the package.

(e) Light Incident on the Interface B at Angles in the Range θ<θc

Figure 15:
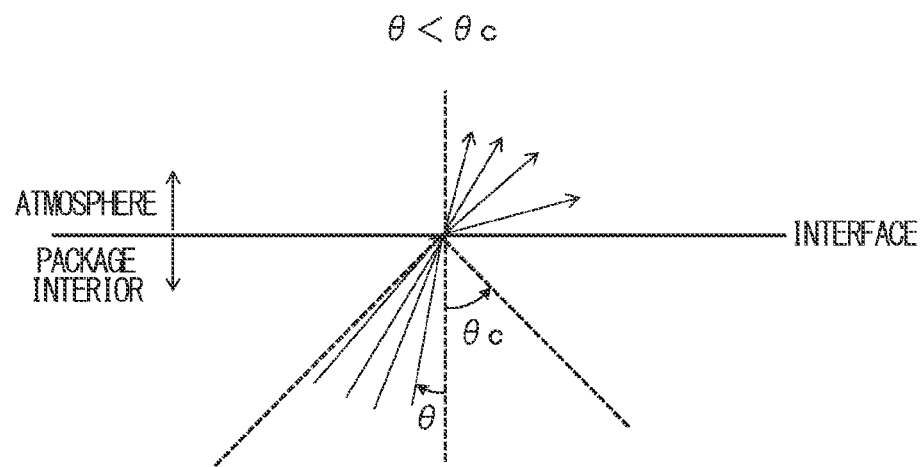
FIG. 15 is a diagram illustrating how light emergent from an LED chip and incident on the interface at angles in a different range than mentioned above travels.

FIG. 15 is a diagram illustrating the path of the light emergent from the LED chip 3 and incident on the interface B at angles in the range (e). In this range of angles, the light emergent from the LED chip 3 is extracted into the layer of air through the interface B.

Even though some light emergent from the LED chip 3 is reflected on the reflector 4 inside the package, it reaches the interface B, and thus fulfills either condition (d) or (e) noted above. Thus, in a complex system, light extraction efficiency has only to be discussed for two parts of light as mentioned above.

Figure 16:
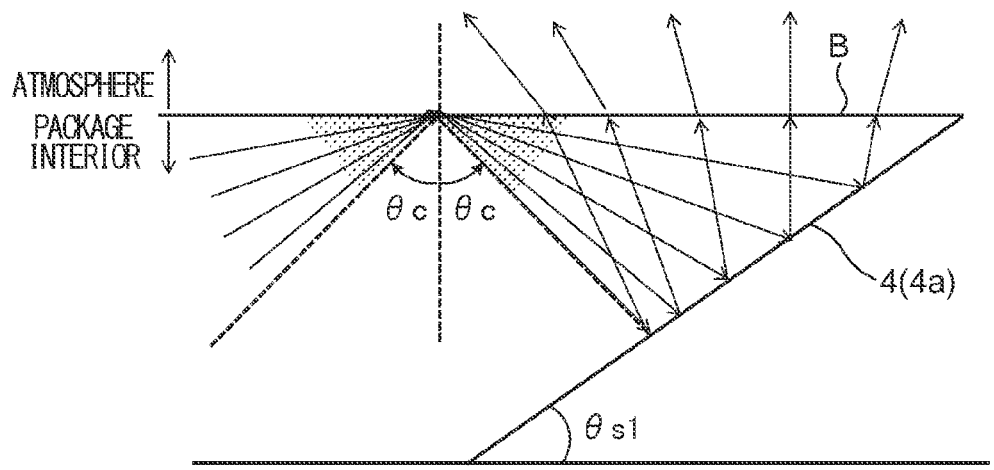
FIG. 16 is a diagram illustrating how light travels when light incident on the interface at angles in the predetermined rage is totally reflected there and is extracted to outside via a reflector.

Here, seeing that the light in the range of angles (e) noted above is extracted out of the package through the interface B, an improvement in extraction efficiency needs to be worked out only for the light in the range of angles (d) noted above that. That is, if, as shown in FIG. 16, the light in the range of angles (d) noted above that is totally reflected on the interface B between the light-transmitting resin 5 and the layer of air can be effectively reflected on the reflector 4 so as to be extracted outside through the interface B, it is then possible to achieve a great improvement in light extraction efficiency.

Here, a study on the rays regularly reflected on the reflector 4 has led to a conclusion that a condition for effective reflection on the reflector 4 of the light that is incident on the interface B in the range of angle (d) noted above and is totally reflected there is to fulfill formula (1) noted previously. This will now be elaborated on.

(Study on Formula (1))

(As to θs1<θc)

First, a case where θs1=θc, that is, a critical case, will be considered. Discussed will be a case where the resin reflective face 4a is inclined at an inclination angle θs1 (relative to the bottom face 21m of the recess 21p) such that rays incident on the interface B at the critical angle θc (also referred to as rays at the critical angle) are totally reflected on the interface B and are then incident on the resin reflective face 4a of the reflector 4 perpendicularly thereto.

Figure 17:
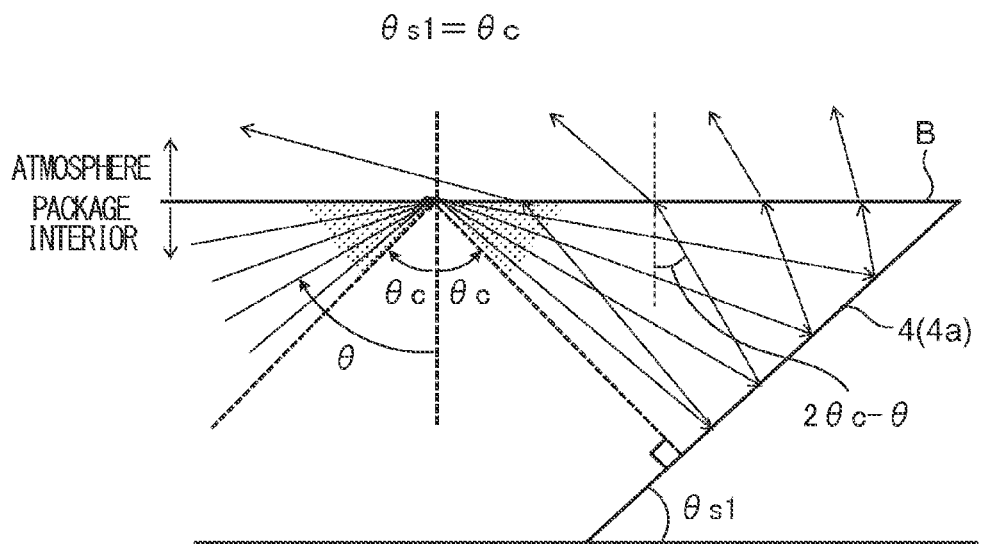
FIG. 17 is a diagram illustrating how light incident on the interface at angles in the predetermined range travels when the inclination angle of a resin reflective face of the reflector is equal to a critical angle.

FIG. 17 is a diagram illustrating how the light in the range of angles (d) noted above travels when θs1=θc. The light incident on the interface B at an angle of incidence θ is first totally reflected on the interface B, is then regularly reflected on the resin reflective face 4a of the reflector 4, and is then incident on the interface B again. At this time, the angle of incidence with respect to the interface B is smaller, namely 2θc−θ. Since, here, as the light that is incident on the interface B for the first time, consideration is given only to the light in the range of angles (d) noted above, namely the light that fulfills θ≥θc and that is totally reflected on the interface B, the angle of incidence (2θc−θ) of the light that is incident on the interface B again is always equal to or smaller than θc, permitting this light to exit through the interface B.

However, the rays at the critical angle such that θ=θc are regularly reflected on the reflective face of the reflector 4 and then travel the same path back, and thus cannot be extracted out of the package. Except these, the rays fulfilling θ<θc (the light in the range of angles (e) noted above) are, as shown in FIG. 15, reflected on the reflective face of the reflector 4 and can all be extracted to outside.

It is now evident that, for all the light that is incident on the interface B again, including the rays at the critical angle such that θ=θc, to be extracted to outside, the angle θs1 has to be slightly smaller than the critical angle θc such that θs1<θc (because the rays at the critical angle such that θ=θc are regularly reflected on the reflective face of the reflector 4 and then, without traveling the same path back, are incident on the interface B at angles equal to or less than the critical angle.

Figure 18:
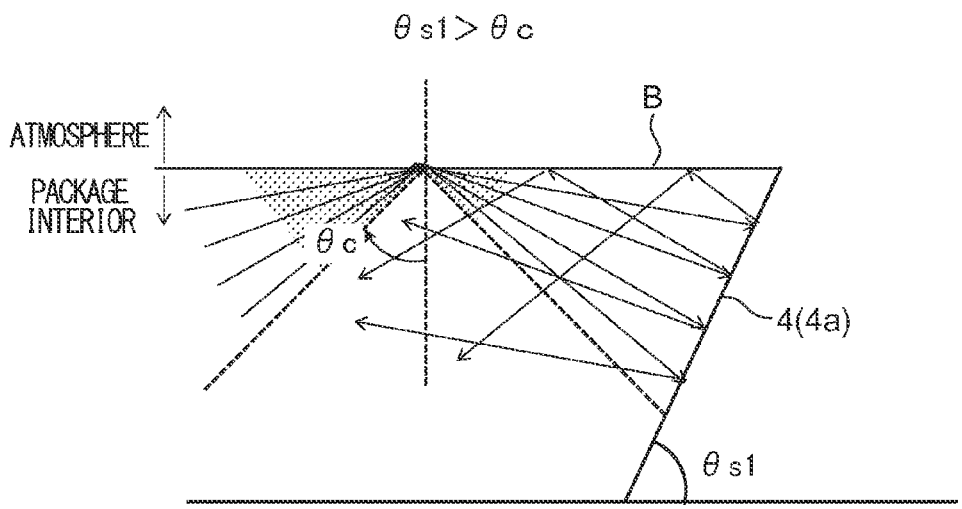
FIG. 18 is a diagram illustrating how light incident on the interface at angles in the predetermined range travels when the inclination angle of a resin reflective face of the reflector is larger than a critical angle.
Figure 19:
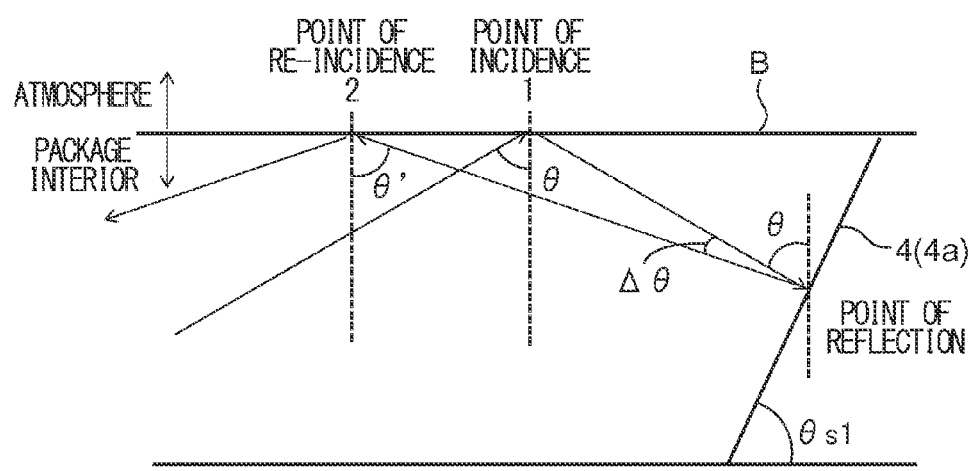
FIG. 19 is a diagram illustrating how light travels when light incident on the interface is totally reflected there, is then reflected on a reflective face of the reflector, and is then incident on the interface again.

For the sake of completeness, a case where θs1>θc will also be studied. FIG. 18 is a diagram illustrating how, when θs1>θc, the light in the range of angles (d) above travels. FIG. 19 shows how the light incident at a point of incidence 1 on the interface B is totally reflected there, is then reflected at a point of reflection on the resin reflective face 4a of the reflector 4, and is then incident at a point of incidence 2 on the interface B again. The light that is incident at the point of incidence 1 at an angle θ such that θ>θc is deflected at the point of reflection through an angle of Δθ=2(θs1−θ), and thus the angle of incidence θ' (°) at the point of incidence 2 equals θ+Δθ. Specifically, $$\theta' = \theta + 2(\theta s1 - \theta)$$
$$= 2\theta s1 - \theta.$$

The conditions for the light incident on the interface B at angles θ and θ' is totally reflected there are, respectively, θ≥θc and θ'≤θc, i.e., θ+2(θs1−θ)≤θc.

These can be merged to obtain

θc≤θ≤2θs1−θc.

This expression can be further modified to obtain

θc≤θ≤θc+2(θs1−θc).

That is, the light that is incident on the interface B for the first time in this range of angles is regularly reflected on the resin reflective face 4a of the reflector 4, and is then, when incident on the interface B again, totally reflected on the interface B; thus, the light cannot be extracted to outside.

Under the previously noted condition θs1=θc, only the light that fulfills θ=θc is, when incident on the interface B again, totally reflected again. In contrast, in a case where the resin reflective face 4a is steeply inclined such that θs1>θc, also the light in the range of angles 2(θs1−θc) about the critical angle θc is, when incident on the interface B again, totally reflected again. Thus, this part of light is additionally confined inside the package, lowering light extraction efficiency.

Incidentally, the light that is incident on the interface B in the range

θ>θc+2(θs1−θc)

is, after reflection on the reflector, so incident on the interface B again as to be extracted out of the package.

(About θs1>45°−θc/2)

Figure 20:
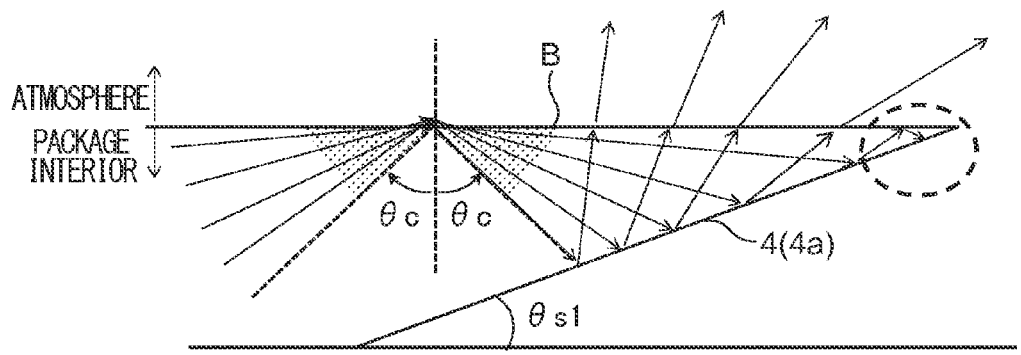
FIG. 20 is a diagram illustrating how light travels when the inclination angle of a resin reflective face of the reflector is significantly smaller than a critical angle.

Subsequent to the study thus far on a case where the inclination angle θs1 of the resin reflective face 4a of the reflector 4 is close to the critical angle θc, now, a similar study on the region where θs1<<θc follows. FIG. 20 is a diagram illustrating how light travels when the inclination angle θs1 of the resin reflective face 4a of the reflector 4 is significantly smaller than the critical angle.

As discussed previously, in a case where the inclination angle θs1 of the resin reflective face 4a of the reflector 4 is close to the critical angle θc, if θs1<θc is fulfilled, when light is incident on the interface B again, all the light can be extracted the outside. However, as shown in FIG. 20, as θs1 approaches 0°, more and more light, starting with light with angles of incidence close to the horizontal direction, that is, starting with light with angles of incidence close to 90° with respect to the interface B, comes to be totally reflected again when incident on the interface B again (see the part enclosed by a broken line in FIG. 20). This phenomenon lowers light extraction efficiency. The critical condition that initiates the phenomenon will now be determined From the study shown in FIG. 19, the angle of incidence θ' of the light that is regularly reflected on the resin reflective face 4a of the reflector 4 and is then incident on the interface B again is given by θ'=2θs1−θ.

The condition under which the light traveling in the horizontal direction (θ=90°) is totally reflected on the interface B, is then regularly reflected on the reflector 4, and is then totally reflected on the interface B again is given by |θ' (θ=90°)|=θc. Hence, 90°−2θs1=θc.

That is,

θs1=(90°−θc)/2=45°−θc/2.

Accordingly, when the inclination angle θs1 of the resin reflective face 4a of the reflector 4 is in the range of 45°−θc/2 or less, light incident on the interface B again is totally reflected. By contrast, when θs1>45°−θc/2, all the light that is incident on the interface B again can be extracted into the atmosphere.

In the light of the above studies, it can be concluded that, to improve the efficiently of light extraction through the interface B, it is necessary to fulfill θs1<θc and θs1>45°−θc/2, which can be merged into 45°−θc/2<θs1<θc.           (Formula (1))

However, in actual designing, it is preferable to avoid the critical angle θs1 in formula (1) taking a value close to the upper limit, i.e., the critical angle θc, or a value close to the lower limit, namely 45°−θc/2. For example, it is preferable to design such that the inclination angle θs1 is close to 22.5°+θc/4, which is the mid value between the upper and lower limits of formula (1). The reasons are that actual reflection of light increases steeply close to the critical angle for total reflection, and that reflection on the type of white resin widely used as the material of the LED package 1 is for a larger part diffusive reflection, which is deviated from regular reflection. That is, to reduce the effect of such factors, and to enhance light extraction efficiency as much as possible, it is preferable to fabricate the LED package 1 under conditions with an ample margin.

(Relationship Between the Index of Refraction of the Light-Transmitting Resin and the Inclination Angle θs1)

Figure 21:
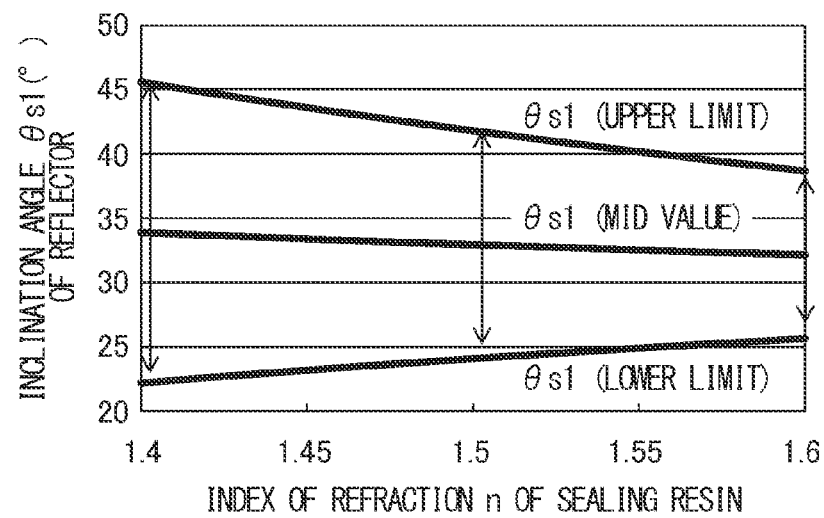
FIG. 21 shows plots of the inclination angle fulfilling formula (1) against the index of refraction of light-transmitting resin.

Next, for different indices of refraction of the light-transmitting resin 5 as the sealing resin, the inclination angle θs1 of the resin reflective face 4a of the reflector 4 that fulfills formula (1) was determined. FIG. 21 shows plots of the inclination angle θs1 that fulfills formula (1) against the index of refraction n of the light-transmitting resin 5.

As the index of refraction n of the light-transmitting resin 5 was varied from 1.4 to 1.6, the upper and lower limits of the ideal inclination angle θs1 fulfilling formula (1) were determined. The results were as follows:

for n=1.4, θs1 (lower limit)=22.0° and θs1 (upper limit)= 45.6°;

for n=1.5, θs1 (lower limit)=24.1° and θs1 (upper limit)= 41.8°; and for n=1.6, θs1 (lower limit)=25.7° and θs1 (upper limit)= 38.7°.

Most ideally, it is preferable that the inclination angle θs1 take a mid value between the upper and lower limits of formula (1) as mentioned previously; specifically, it is preferable that, for n=1.4, 1.5, and 1.6, the inclination angle θs1 be an angle equal to or close to 33.9°, 33.0°, and 32.2° respectively.

[Inclination Angle of the Metal Reflective Face of the Recess]

Next, a description will be given of the inclination angle of the metal reflective face 21a of the recess 21p in which the LED chip 3 is arranged. In the embodiment, when the inclination angle of the metal reflective face 21a is represented by θs2 (°), formula (2) below is further fulfilled:

$$35° \leq \theta s2 \leq 55°. \quad (2)$$

Underlying Factors Will be Discussed Below.

As discussed previously, in a structure where a high-output blue or bluish LED chip is packaged in a reflector formed of white resin, if light from the LED chip directly enters the white resin, the white resin turns yellow. This significantly diminishes the light output of the package, and significantly shortens the lifetime of the package. To avoid that, in the embodiment, the recess 21p is formed in the metal lead frame 2, and the LED chip 3 is arranged inside the recess 21p. This structure (a) gives an increased distance from the LED chip 3 to the resin reflective face 4a of the reflector 4, and (b) helps reduce the amount of light that is incident from the LED chip 3 directly on the reflector 4. Owing to these two benefits, it is possible to avoid irradiating the white resin with light with extremely high luminance per unit area, to alleviate deterioration of the white resin and thereby to suppress a lowering in light output, and to prolong the lifetime of the package. Accordingly, the LED package 1 according to the embodiment employing a blue LED with extremely high luminance is suitable in backlights for display devices such as liquid crystal panel televisions and in illumination devices for illuminating illumination targets.

In particular, owing to the recess 21p being given a depth greater than the thickness of the LED chip 3, the light emergent sideways from the LED chip 3 can mostly be reflected on the metal reflective face 21a of the recess 21p so as not to be incident directly on the reflector 4 across a short distance, and this helps reliably suppress deterioration of the inner wall of the reflector 4.

Figure 22:
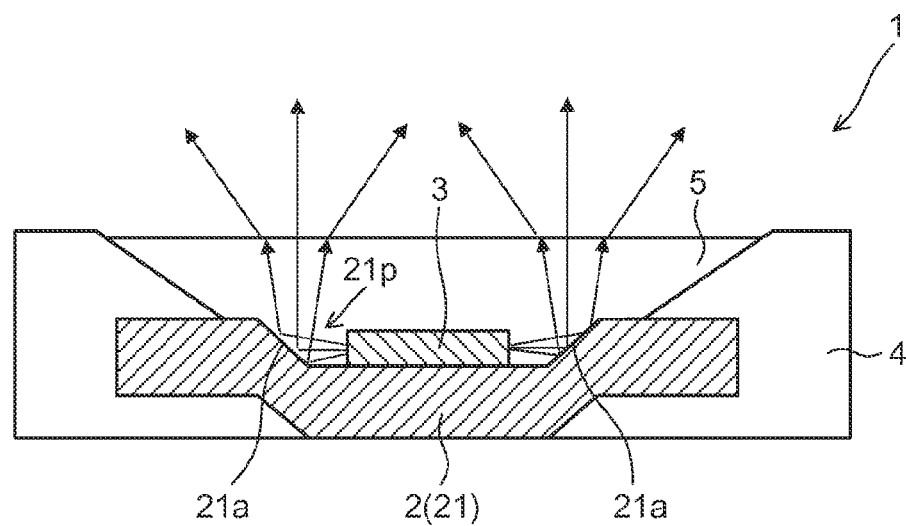
FIG. 22 is a diagram illustrating how light emerging sideways from an LED chip travels in the LED package.

FIG. 22 is a diagram illustrating how the light emergent sideways from the LED chip 3 travels in the LED package 1 according to the embodiment. The LED chip 3 is surrounded by the side face (metal reflective face 21a) of the recess 21p in the metal lead frame 2, and thus much of the light radiated sideways from the chip is reflected on the metal reflective face 21a so as to be deflected frontward. Here, by giving the metal reflective face 21a of the recess 21p an appropriate inclination angle, it is possible to extract light efficiently out of the light-transmitting resin 5.

Figure 23:
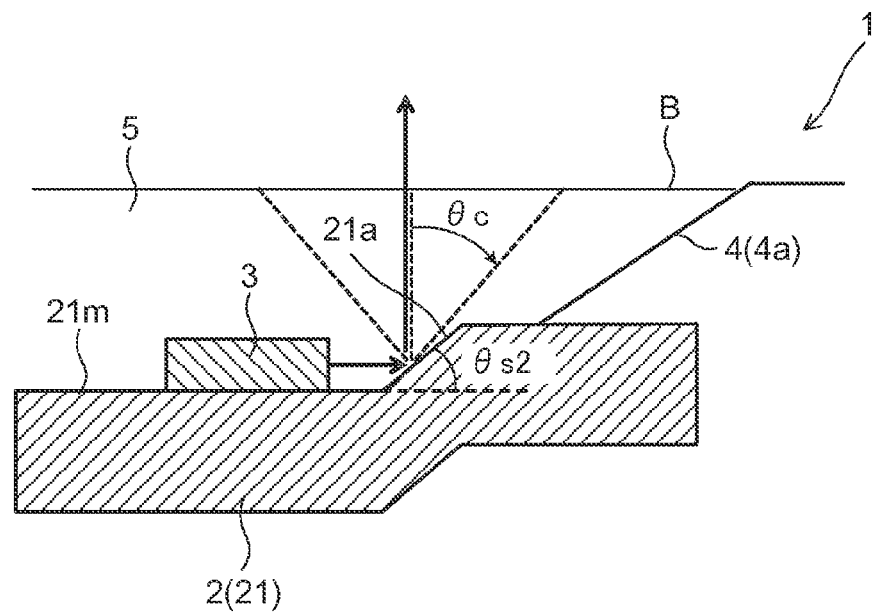
FIG. 23 is a diagram illustrating part of the LED package in FIG. 22 on an enlarged scale.

FIG. 23 is a diagram illustrating, on an enlarged scale, part of the LED package 1 shown in FIG. 22. To efficiently extract the light emergent from the side face of the LED chip 3 out of the light-transmitting resin 5, it is preferable to give the metal reflective face 21a an inclination angle θs2 such that, when light is reflected on the metal lead frame 2, as much light as possible enters a conical region with an apical angle 2θc having its apex at the point of reflection. The light that has entered the conical region is incident on the interface B at angles smaller than the critical angle θc, and thus it can be extracted without being totally reflected on the interface B back inside the package.

It is preferable that the inclination angle θs2 of the metal reflective face 21a equal 45°. With the inclination angle θs2 so set, the light emergent in the direction (axial direction) perpendicular to the chip side face is, when reflected on the metal reflective face 21a with an inclination angle of 45°, deflected through 90°, and is thus incident on the interface B perpendicularly thereto. Also the light emergent from the chip side face at angles close to perpendicular thereto is incident on the interface B with slight inclinations relative to the direction perpendicular thereto. Thus, light can be efficiently extracted out of the package with almost no reflection on the interface B.

Here, in a case where the intensity of the light emergent in the direction perpendicular to the chip side face is high, it is optimal to set θs2=45. However, in general, depending on chip thickness and chip structure, such as a reflective face on the reverse side, the direction in which the light emergent from the chip side face has the maximum intensity can be inclined from the axis perpendicular to the chip side face.

Figure 24:
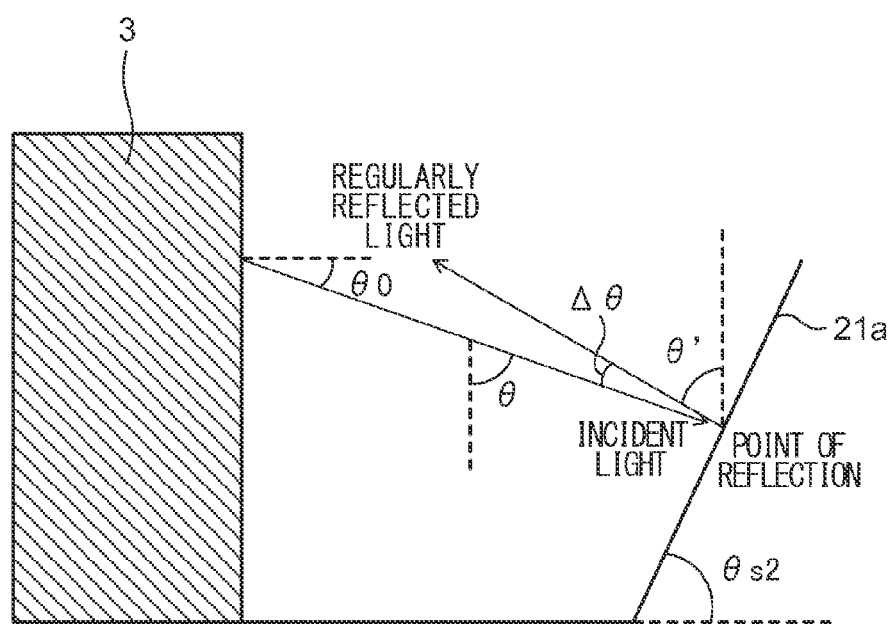
FIG. 24 is a diagram illustrating how light emergent from a side face of an LED chip travels with an inclination relative to an axis perpendicular to the side face.

FIG. 24 is a diagram illustrating how light emergent from the chip side face travels with an inclination relative to the axis perpendicular to the chip side face. Here, it is assumed that the light emergent from the side face of the LED chip 3 in a direction inclined at an angle of θ0 (°) relative to the axis perpendicular to the side face forms an angle θ (°) relative to the axis perpendicular to the interface B. It is also assumed that the just-mentioned light is, when regularly reflected on the metal reflective face 21a, deflected through Δθ (°), and that the light after regular reflection forms an angle θ' (°) relative to the axis perpendicular to the interface B.

In FIG. 24, the light emergent from the side face of the LED chip 3 in the direction at an angle θ relative to the axis perpendicular to the interface B is, when regularly reflected on the metal reflective face 21a, deflected through an angle given by $$\Delta\theta = 2(\theta s2 - \theta).$$

Thus, the angle θ' after regular reflection is given by $$\theta' = \theta + \Delta\theta$$

That is, $$\theta' = \theta + 2(\theta s2 - \theta)$$
$$= 2\theta s2 - \theta.$$

Figure 25:
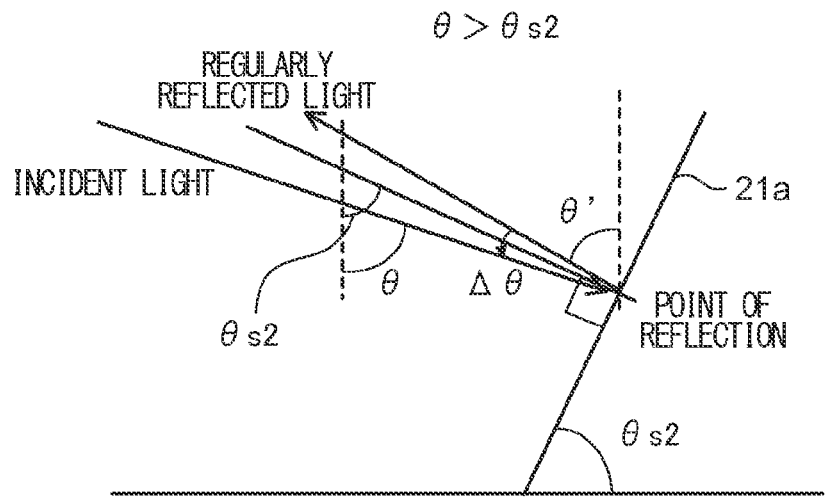
FIG. 25 is a diagram illustrating how light emergent from a side face of an LED chip is regularly reflected upward (toward an interface) on a metal reflective face.

Whether Δθ is positive or negative is defined as follows. FIG. 25 is a diagram illustrating how light emergent from the chip side face is regularly reflected upward (toward the interface B) on the metal reflective face 21a. Incident light is regularly reflected as shown in FIG. 25 when θ>θs2. In this case, Δθ=2(θs2−θ)<0.

That is, Δθ is negative.

Figure 26:
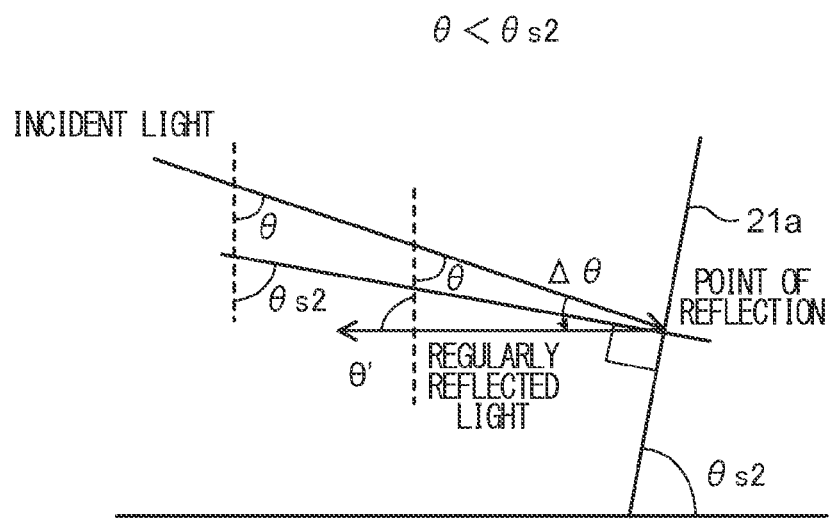
FIG. 26 is a diagram illustrating how light emergent from a side face of an LED chip is regularly reflected downward on a metal reflective face.

On the other hand, FIG. 26 is a diagram illustrating how light emergent from the chip side face is regularly reflected down on the metal reflective face 21a. Incident light is regularly reflected as shown in FIG. 26 when θ<θs2. In this case, Δθ=2(θs2−θ)>0.

That is, Δθ is positive.

By setting the inclination angle θs2 of the metal reflective face 21a such that the angle θ' equals 0 even when light emergent from the chip side face travels in a direction inclined relative to the axis perpendicular to the chip side face, it is possible to make the light regularly reflected on the metal reflective face 21a incident on the interface B perpendicularly thereto, and to extract the light efficiently.

For example, in a case where the direction of emergence of the light emergent from the chip side face is inclined at 20° downward relative to the direction of the axis of the chip side face (θ0=20°), the inclination angle θs2 of the metal reflective face 21a can be set at 35°; by contrast, in a case where the direction of emergence is inclined at 20° upward (θ0=−20°), the inclination angle θs2 of the metal reflective face 21a can be set at 55°. Then, in either case, it is possible to make the light regularly reflected on the metal reflective face 21a incident on the interface B perpendicular thereto, and to extract the light efficiently. This will now be elaborated on with reference to the drawings.

Figure 27:
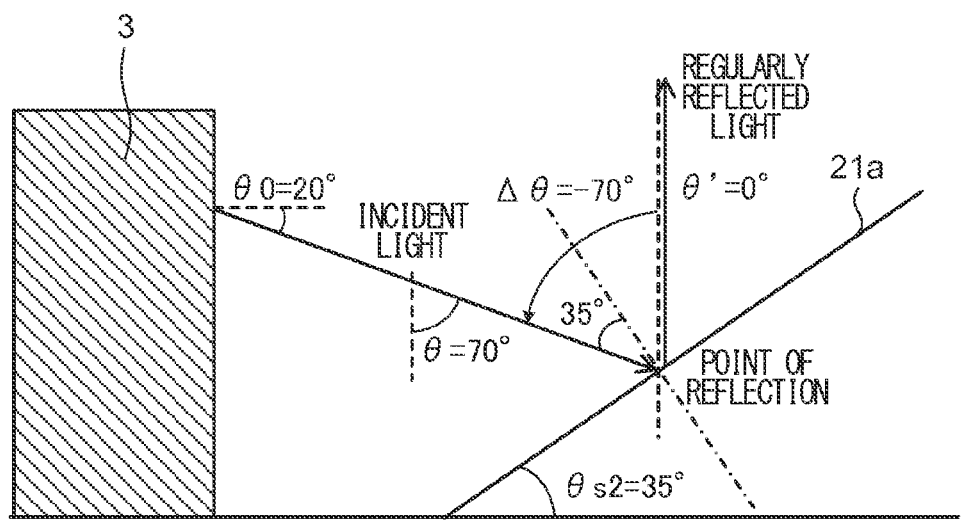
FIG. 27 is a diagram illustrating how light emergent from a side face of an LED chip with a downward inclination of 20° travels.

FIG. 27 is a diagram illustrating how the light emergent from the chip side face at θ0=20° travels. For the angle θ' after regular reflection on the metal reflective face 21a to be 0°, the inclination angle θs2 can be set such that θ'=2θs2−θ=0°.

This gives

θs2=θ/2.

Moreover, since

θ=90°−θ0, we have $$\theta s2 = (90° - \theta 0)/2$$
$$= (90° - 20°)/2$$
$$= 35°.$$

Incidentally, in this case, the angle Δθ through which the light incident on the metal reflective face 21a is deflected is given by $$\Delta\theta = 2(\theta s2 - \theta)$$
$$= 2(\theta s2 - (90° - \theta 0))$$
$$= 2(35° - (90° - 20))$$
$$= -70°.$$

Figure 28:
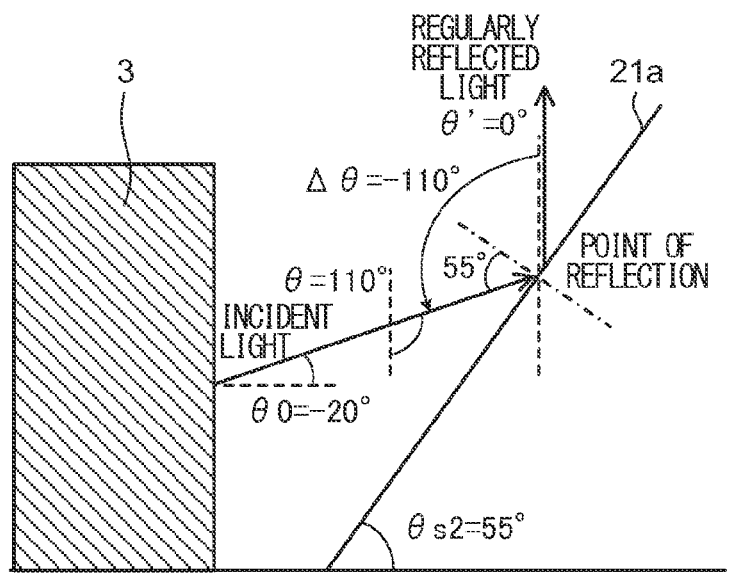
FIG. 28 is a diagram illustrating how light emergent from a side face of an LED chip with an upward inclination of 20° travels.

On the other hand, FIG. 28 is a diagram illustrating how the light emergent from the chip side face at θ0=−20° travels. By the same reasoning as in the case where θ0=20°, $$\theta s2 = (90° - \theta 0)/2$$
$$= (90° - (-20°))/2$$
$$= 55°.$$

Incidentally, in this case, the angle Δθ through which the light incident on the metal reflective face 21a is deflected is given by $$\Delta\theta = 2(\theta s2 - \theta)$$
$$= 2(\theta s2 - (90° - \theta 0))$$
$$= 2(55° - (90° - (-20°)))$$
$$= -110°.$$

Considering that the light distribution pattern varies depending on the structure of the LED chip 3 as discussed above, the inclination angle θs2 of the metal reflective face 21a can vary within the range of 45°±10°. Accordingly, with such a light distribution pattern taken into account, fulfilling formula (2) noted above makes it possible to make the light emergent sideways from the chip incident on the interface B approximately perpendicularly thereto via the metal reflective face 21a. It can safely be said that, in this way, light can be extracted efficiently without reflection on the interface B.

To make the LED package 1 compatible with varying light distribution patterns of different LEDs, it is particularly preferable to set the inclination angle θs2 of the metal reflective face 21a at 45°.

[Distance Between the LED Chip and the Interface]

Figure 29:
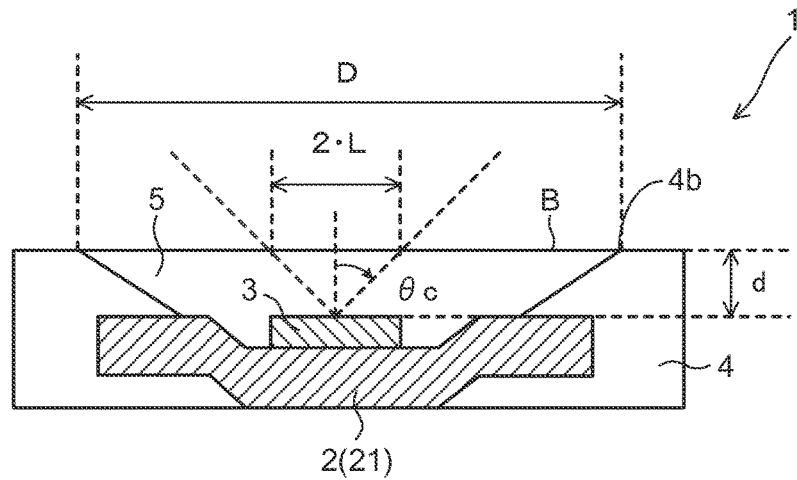
FIG. 29 is a simplified sectional view of the LED package.

FIG. 29 is a simplified sectional view of the LED package 1 described above. It is preferable that the LED package 1 further fulfill formula (3) below:

$$D > 2 \cdot d \cdot \tan \theta c \qquad (3)$$

where

D represents the minimum width (mm) of the opening where the interface between the light-transmitting resin and the layer of air is located in the reflector, as measured in a cross section passing through the light-emitting element (LED chip); and d represents the distance (mm) from the top face of the light-emitting element to the interface between the light-transmitting resin and the layer of air.

Here, the symbol D above represents, in a case where the opening 4b in the reflector 4 is rectangular in shape as seen in a plan view, the width in the shorter-side direction thereof and, in a case where the opening 4b is circular in shape as seen in a plan view (see FIG. 38), the diameter.

As shown in FIG. 29, in a case where the minimum width D (mm) of the opening 4b where the interface B is located in the reflector 4 is greater than 2L=2(d·tan θc), out of the light emergent from the center of the top face of the LED chip 3, the light radiated inside the cone with an apex angle $2\theta c$ can be extracted to outside without total reflection on the interface B between the light-transmitting resin 5 and the layer of air, but the light radiated outside the cone is incident on the interface B at angles of incidence equal to or larger than the critical angle and is thus totally reflected there. Thus, the structure according to the embodiment (including the formulae noted above), which improves the efficiency of extraction of such totally reflected light, is extremely effective in a flat LED package 1 as described above (where d is far smaller than D).

[Resin Inclined Face and Metal Reflective Face Fulfilling the Formulae]

Fulfilling formula (1) noted above for at least one of the four resin inclined faces $4a_1$ to $4a_4$ (see FIG. 1) constituting the resin reflective face $4a$ gives an effect of improving light extraction efficiency; fulfilling it for all the resin inclined faces $4a_1$ to $4a_4$ gives the maximal effect, and is therefore preferable.

Fulfilling formula (2) noted above for at least one of the four metal reflective faces $21a_1$ to $21a_4$ (see FIG. 1) constituting the metal reflective face $21a$ allows efficient extraction of the light emergent sideways from the chip through the interface B via the metal reflective face $21a$; fulfilling it for all the metal reflective faces $21a_1$ to $21a_4$ gives the maximal effect, and is therefore preferable.

That is, it is preferable that each of the resin inclined faces $4a_1$ to $4a_4$ fulfill $\theta s1<\theta s2$ for each of the metal reflective faces $21a_1$ to $21a_4$, that formula (1) is fulfilled for each of the resin inclined faces $4a_1$ to $4a_4$, and that formula (2) is fulfilled for each of the metal reflective faces $21a_1$ to $21a_4$. The LED package 1 shown in FIG. 1 is designed to fulfill those conditions.

Among the four metal reflective faces $21a_3$ to $21a_4$, the two metal reflective faces $21a_3$ and $21a_4$ located along the shorter-side direction have a smaller area than the two metal reflective faces $21a_1$ and $21a_2$ located along the longer-side direction, thus receive less light from the LED chip 3, and thus have a smaller effect on light extraction efficiency. With this taken into account, it can safely be said that when formula (1) is fulfilled for each of the four resin inclined faces $4a_1$ to $4a_4$ and in addition formula (2) is fulfilled for the two metal reflective faces $21a_1$ and $21a_2$ located along the longer-side direction, it is possible to improve the efficiency of light extraction to outside.

Figure 30A:
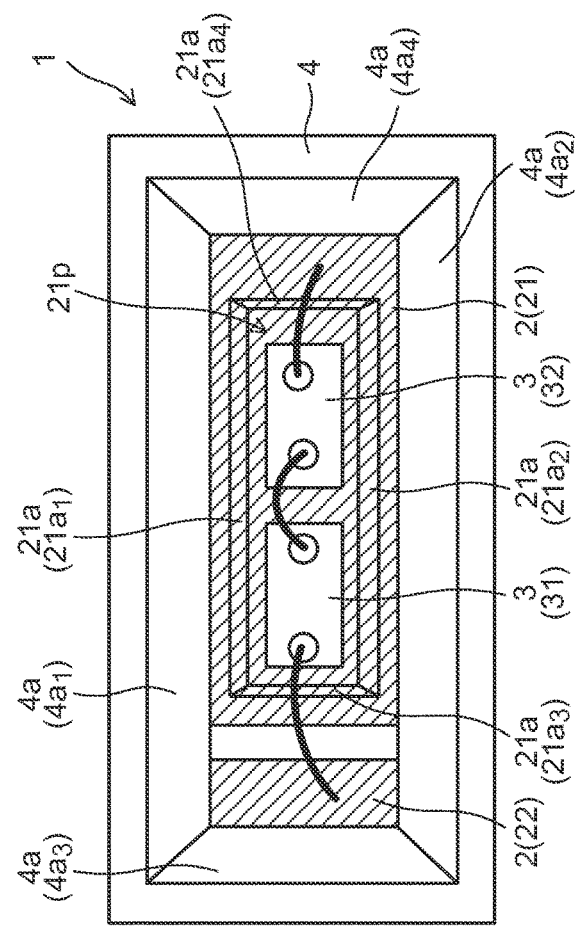
FIG. 30A is a plan view showing another structure of the LED package.
Figure 30B:
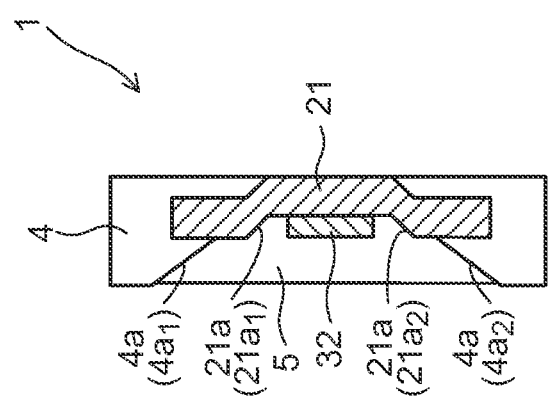
FIG. 30B is a sectional view of the LED package across a sectional plane perpendicular to the shorter-side direction thereof.
Figure 30C:
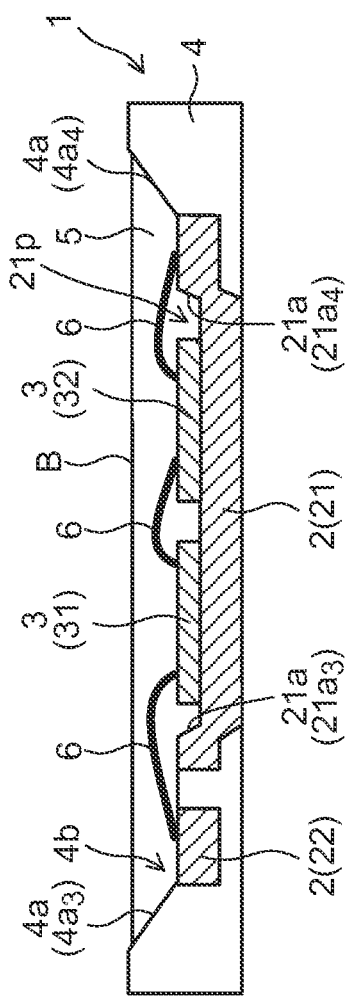
FIG. 30C is a sectional view of the LED package across a sectional plane perpendicular to the longer-side direction thereof.

FIG. 30A is a plan view showing another structure of the LED package 1, FIG. 30B is a sectional view of the LED package 1 across a sectional plane perpendicular to the shorter-side direction thereof, and FIG. 30C is a sectional view of the LED package 1 across a sectional plane perpendicular to the longer-side direction thereof. This LED package 1 is so designed that, among the four resin inclined faces $4a_1$ to $4a_4$, the two resin inclined faces $4a_3$ and $4a_4$ located along the shorter-side direction each fulfill $\theta s1<\theta s2$ for, among the fourth metal reflective faces $21a_1$ to $21a_4$, the two metal reflective faces $21a_1$ and $21a_2$ locate along the longer-side direction. In addition, formula (1) is fulfilled for the two resin inclined faces $4a_3$ and $4a_4$ located along the shorter-side direction, and formula (2) is fulfilled for the two metal reflective faces $21a_1$ and $21a_2$ located along the longer-side direction.

Figure 31A:
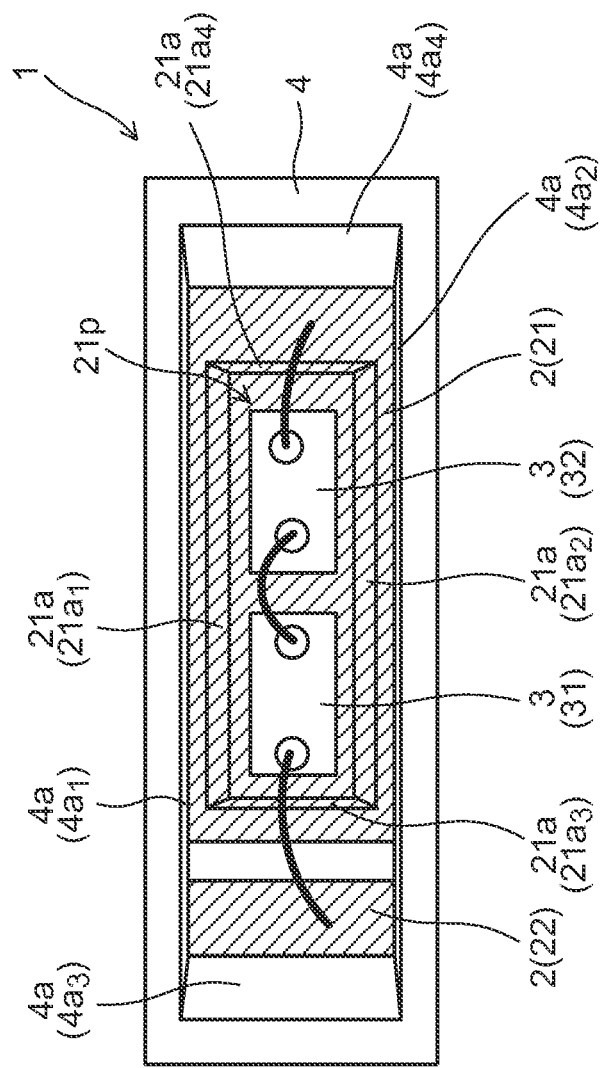
FIG. 31A is a plan view showing yet another structure of the LED package.
Figure 31B:
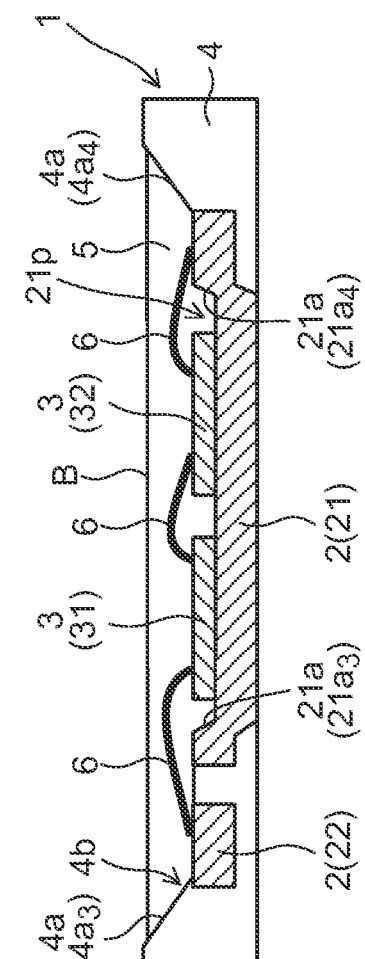
FIG. 31B is a sectional view of the LED package across a sectional plane perpendicular to the shorter-side direction thereof.
Figure 31C:
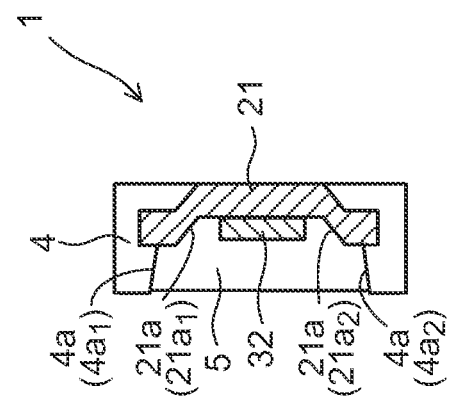
FIG. 31C is a sectional view of the LED package across a sectional plane perpendicular to the longer-side direction thereof.

FIG. 31A is a plan view showing yet another structure of the LED package 1, FIG. 31B is a sectional view of the LED package 1 across a sectional plane perpendicular to the shorter-side direction thereof, and FIG. 31C is a sectional view of the LED package 1 across a sectional plane perpendicular to the longer-side direction thereof. This LED package 1 has a similar design as the one shown in FIG. 30 except that the dimension in the shorter-side direction is smaller than in FIG. 30.

In a case where the LED package 1 of the embodiment is applied to a backlight 210 in a later-described liquid crystal display device 200 (see FIG. 40), slimming down the backlight 210 necessitates reducing the dimension of the LED package 1 in the shorter-side direction, which corresponds to the thickness direction of a light guide plate 213. Here, it is easier, with the two resin inclined faces $4a_3$ and $4a_4$ located along the shorter-side direction of the LED package 1 than with the two resin inclined faces $4a_1$ and $4a_2$ located along the longer-side direction, to design them such that the inclination angle $\theta s1$ is smaller than the inclination angle $\theta s2$. This is because, under the conditions where the dimension of the LED package 1 in the shorter-side direction is restricted to a given extent to cope with the slimming down of the backlight 210, it is difficult to reduce the inclination angle of the resin inclined faces $4a_1$ and $4a_2$ (because the direction in which the inclination angle of the resin inclined faces $4a_1$ and $4a_2$ is reduced corresponds to the direction in which the dimension of the LED package 1 in the shorter-side direction is increased). Likewise, the direction in which the inclination angle of the resin inclined faces $4a_3$ and $4a_4$ is reduced corresponds to the direction in which the dimension of the LED package 1 in the longer-side direction is increased, but this direction is unrelated to the slimming down of the backlight 210, and is therefore subject to no restriction whatever.

Thus, in terms of reducing the inclination angle, the resin inclined faces $4a_3$ and $4a_4$ allow more freedom than the resin inclined faces $4a_1$ and $4a_2$, making it easier for the former than for the latter to work out a design fulfilling formula (1). Accordingly, by fulfilling formula (1) for the two resin inclined faces $4a_3$ and $4a_4$ located along the shorter-side direction, it is possible to improve light extraction efficiency with a structure compatible with the flat backlight 210.

Moreover, among the four metal reflective faces $21a_1$ to $21a_4$, the two metal reflective faces $21a_1$ and $21az$ located along the longer-side direction have a larger area than the two metal reflective faces $21a_3$ and $21a_4$ located along the shorter-side direction, and thus receive more light from the LED chip 3. Accordingly, by fulfilling formula (2) for the two metal reflective faces $21a_1$ and $21az$ located along the longer-side direction, it is possible to more efficiently extract the light that is emergent sideways from the LED chip 3 and is incident on the interface B via the metal reflective face $21a$.

Figure 32A:
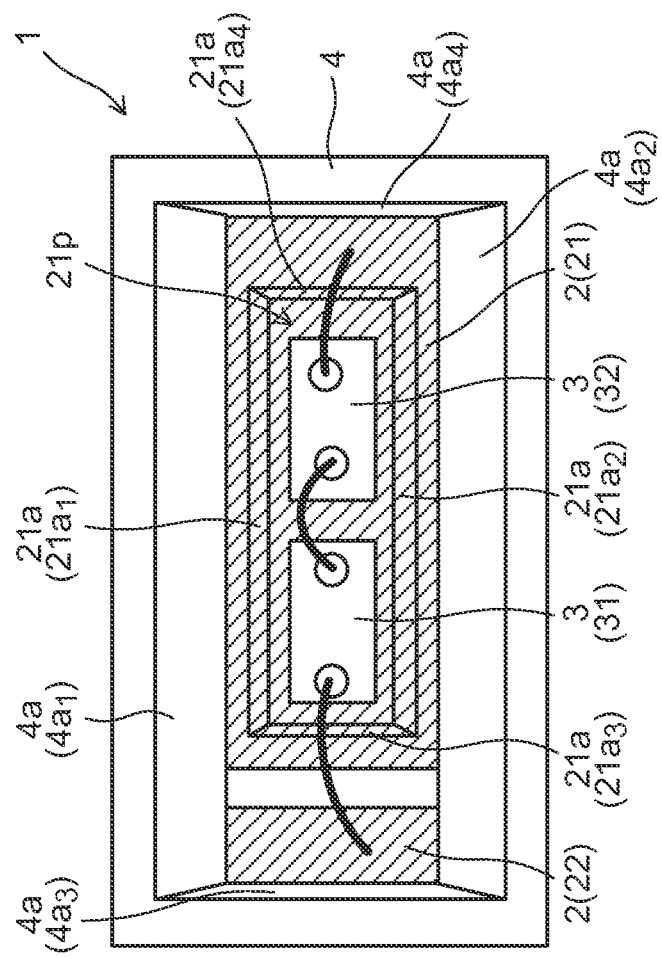
FIG. 32A is a plan view showing still another structure of the LED package.
Figure 32B:
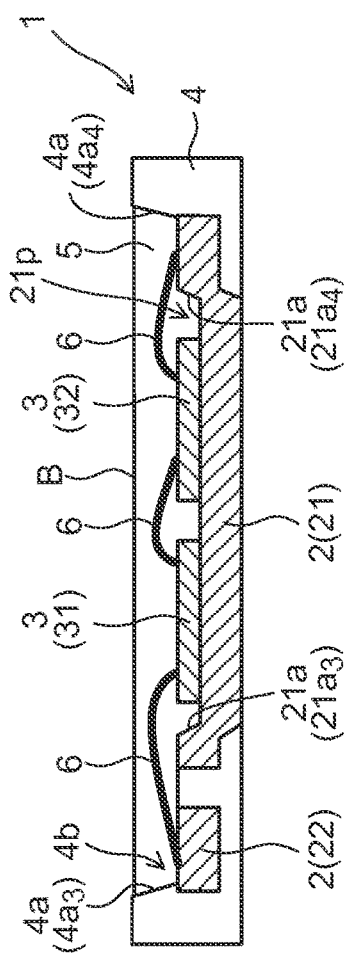
FIG. 32B is a sectional view of the LED package across a sectional plane perpendicular to the shorter-side direction thereof.
Figure 32C:
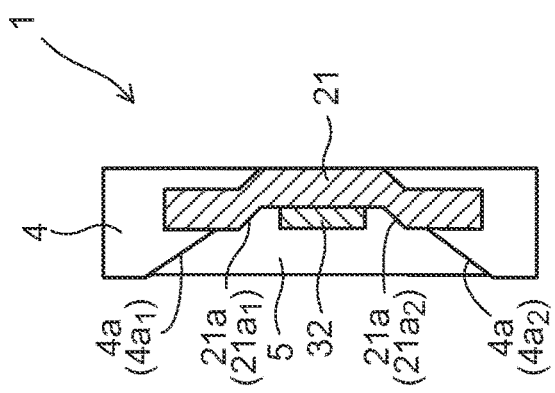
FIG. 32C is a sectional view of the LED package across a sectional plane perpendicular to the longer-side direction thereof.

FIG. 32A is a plan view showing still another structure of the LED package 1, FIG. 32B is a sectional view of the LED package 1 across a sectional plane perpendicular to the shorter-side direction thereof, and FIG. 32C is a sectional view of the LED package 1 across a sectional plane perpendicular to the longer-side direction thereof. This LED package 1 is so designed that, among the four resin inclined faces $4a_1$ to $4a_4$, the two resin inclined faces $4a_1$ and $4a_2$ located along the longer-side direction each fulfill $\theta s1<\theta s2$ for, among the four metal reflective faces $21a_1$ to $21a_4$, the two metal reflective faces $21a_1$ and $21a_2$ located along the longer-side direction. In addition, formula (1) is fulfilled for the two resin inclined faces $4a_1$ and $4a_2$ located along the longer-side direction, and formula (2) is fulfilled for the two metal reflective faces $21a_1$ and $21a_2$ located in the longer-side direction.

Figure 33A:
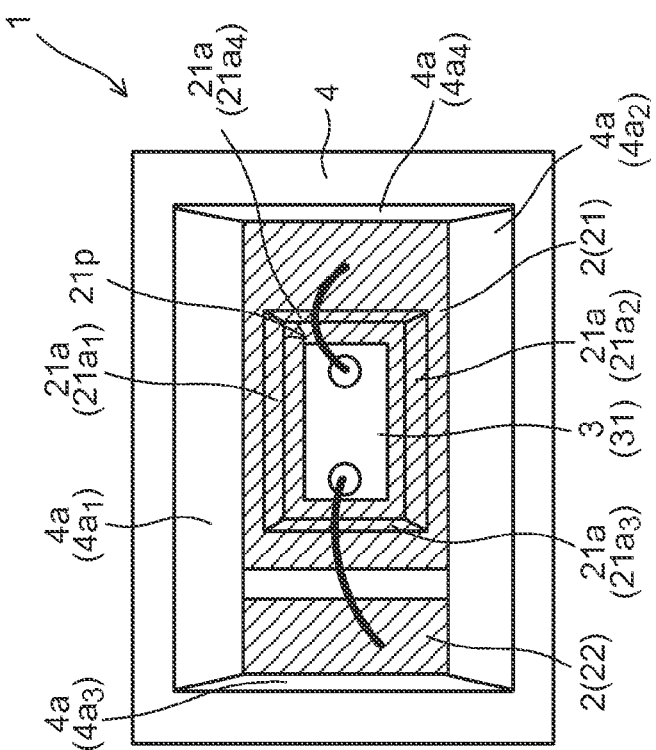
FIG. 33A is a plan view showing still another structure of the LED package.
Figure 33B:
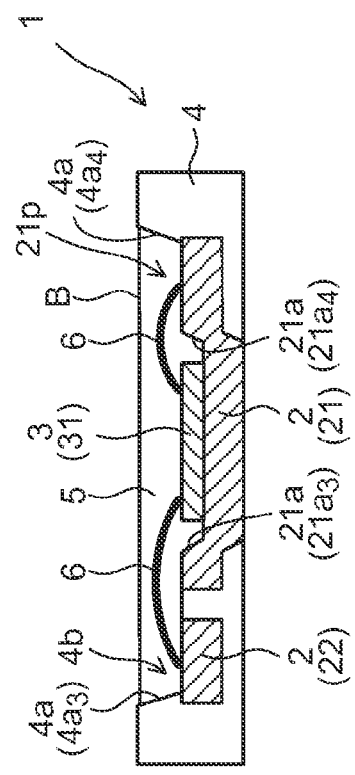
FIG. 33B is a sectional view of the LED package across a sectional plane perpendicular to the shorter-side direction thereof.

FIG. 33A is a plan view showing yet another structure of the LED package 1, FIG. 33B is a sectional view of the LED package 1 across a sectional plane perpendicular to the shorter-side direction thereof, and FIG. 33C is a sectional view of the LED package 1 across a sectional plane perpendicular to the longer-side direction thereof. This LED package 1 has a similar design as the one shown in FIG. 32 except that a single LED chip 3 is used and that the dimension of the package in the longer-side direction is shorter.

Among the four resin inclined faces $4a_1$ to $4a_4$, the two resin inclined faces $4a_1$ and $4a_2$ located along the longer-side direction of the LED package 1 have a larger area than the two resin inclined faces $4a_3$ and $4a_4$ located along the shorter-side direction, and thus receive more light. Thus, by fulfilling formula (1) for the two resin inclined faces $4a_1$ and $4a_2$ located along the longer-side direction, it is possible to extract the light incident on the interface B. For example, in a case where the LED package 1 is applied to a later-described illumination device 100 (see FIG. 39), the dimension of the LED package 1 in the shorter-side direction is subject to no restriction. Thus, it can safely be said that the LED package 1 designed as shown in FIGS. 32 and 33 is suitable for an illumination device 100.

Likewise, the two metal reflective faces $21a_1$ and $21a_2$ located along the longer-side direction of the LED package 1 have a larger area than the two metal reflective faces $21a_3$ and $21a_4$ located along the shorter-side direction, and receive more light from the LED chip 3. Thus, by fulfilling formula (2) for the two metal reflective faces $21a_1$ and $21a_2$, it is possible to efficiently extract the light that is emergent sideways from the LED chip 3 and is incident on the interface B via the metal reflective face $21a$.

Moreover, in a structure as shown in FIGS. 30 to 32 where a plurality of LED chips 3 are arranged side by side in the longer-side direction of the package with the longer sides of the chips aligned with the longer-side direction of the package, an increased amount of light is incident on the interface B between the light-transmitting resin 5 and the layer of air at angles of incidence larger than the critical angle θc, and this tends to lower the efficienly of light extraction through the interface B. Thus, the structure according to the embodiment, which helps improve light extraction efficiency, is extremely effective in cases where a plurality of LED chips are arranged side by side in the longer-side direction.

[Modified Examples of Light-Emitting Devices]

Figure 34B:
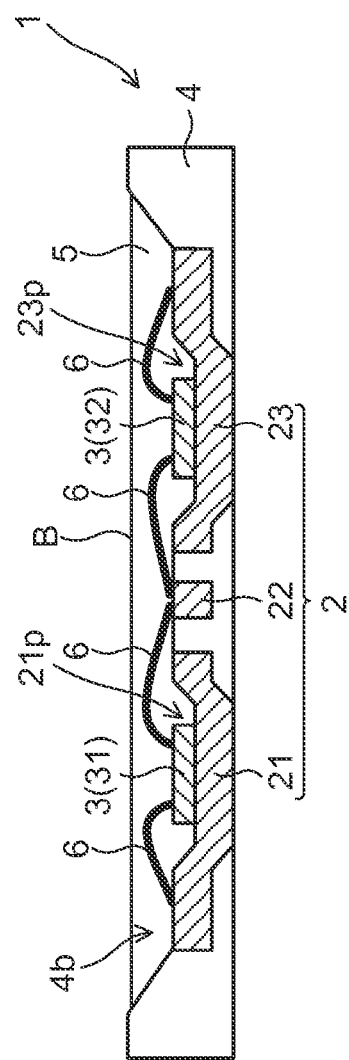
FIG. 34B is a sectional view of the LED package across a sectional plane perpendicular to the shorter-side direction thereof.
Figure 34C:
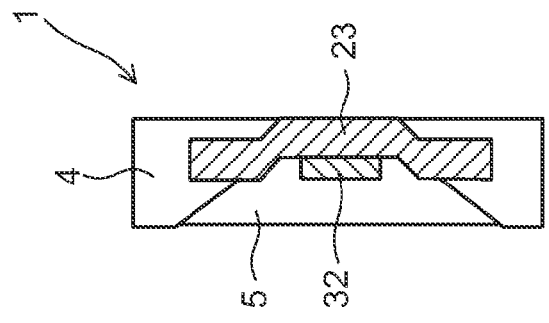
FIG. 34C is a sectional view of the LED package across a sectional plane perpendicular to the longer-side direction thereof.

FIG. 34A is a plan view showing yet another structure of the LED package 1, FIG. 34B is a sectional view of the LED package 1 across a sectional plane perpendicular to the shorter-side direction thereof, and FIG. 34C is a sectional view of the LED package 1 across a sectional plane perpendicular to the longer-side direction thereof.

The metal lead frame 2 can comprise three metal lead frames 21 to 23 which are electrically connected to an external power supply. The LED chips 31 and 32 can be arranged on separate metal lead frames 21 and 23. In this case, the first electrode 31a of the LED chip 31 can be connected to the metal lead frame 21 by a metal lead 6, the second electrode 31b of the LED chip 31 can be connected to the metal lead frame 22 by a metal lead 6, the first electrode 32a of the LED chip 32 can be connected to the metal lead frame 22 by a metal lead 6, and the second electrode 32b of the LED chip 32 can be connected to the metal lead frame 23 by a metal lead 6.

Also with this structure, it is possible, by arranging the LED chips 31 and 32 in recesses 21p and 23p in the metal lead frames 21 and 23 respectively, to suppress discoloration of the inner wall of the reflector 4 and prolong the lifetime of the package, and simultaneously, by fulfilling formulae (1) and (2) for the resin inclined faces and the metal reflective faces which fulfill θs1<θs2, to satisfactorily improve the efficiency of light extraction to outside.

Figure 35A:
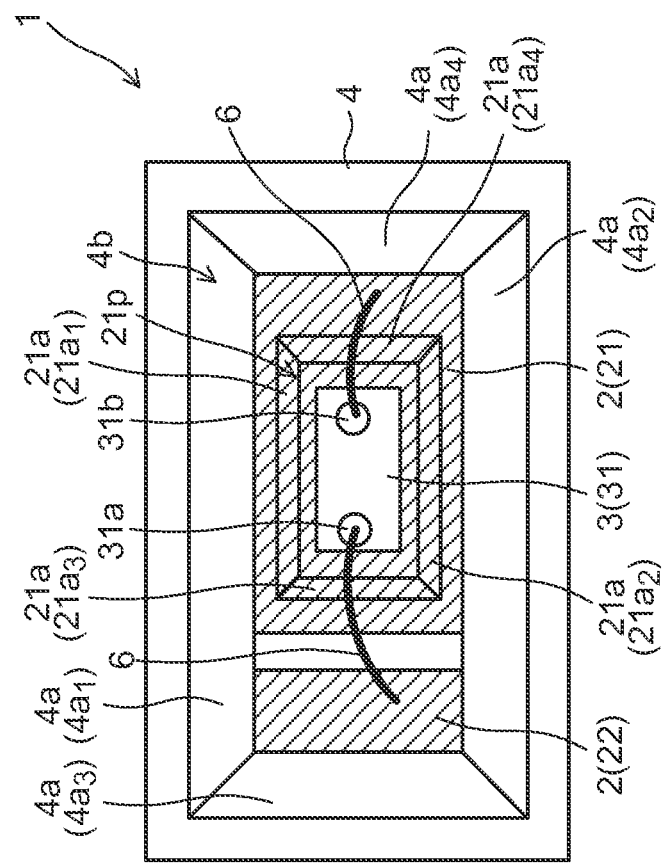
FIG. 35A is a plan view showing still another structure of the LED package.
Figure 35B:
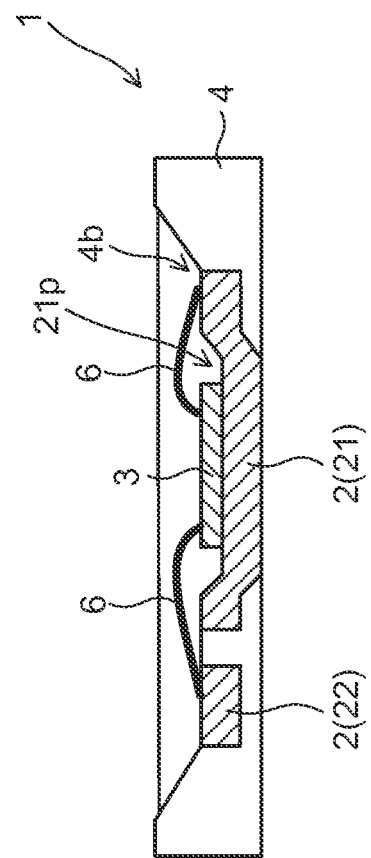
FIG. 35B is a sectional view of the LED package across a sectional plane perpendicular to the shorter-side direction thereof.
Figure 35C:
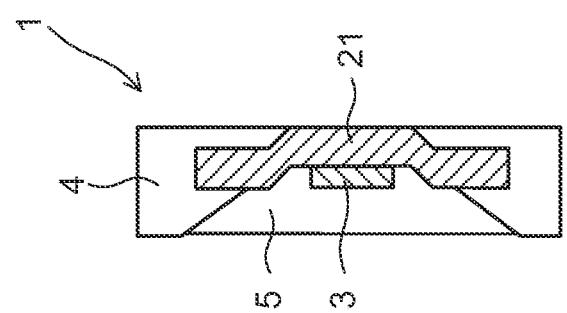
FIG. 35C is a sectional view of the LED package across a sectional plane perpendicular to the longer-side direction thereof.

FIG. 35A is a plan view showing yet another structure of the LED package 1, FIG. 35B is a sectional view of the LED package 1 across a sectional plane perpendicular to the shorter-side direction thereof, and FIG. 35C is a sectional view of the LED package 1 across a sectional plane perpendicular to the longer-side direction thereof.

The LED package 1 can be provided with a single LED chip 3 as in FIG. 33. In this case, the first electrode 31a of the LED chip 31 can be connected to the metal lead frame 22 by a metal lead 6, and the second electrode 31b of the LED chip 31 can be connected to the metal lead frame 21, on which the LED chip 31 is arranged, by a metal lead 6.

Also with this structure, it is possible, by arranging the LED chip 31 inside a recess 21p in the metal lead frame 21, to suppress discoloration of the inner wall of the reflector 4 and prolong the lifetime of the package, and simultaneously, by fulfilling formulae (1) and (2) for the resin inclined faces and the metal reflective faces which fulfill θs1<θs2, to satisfactorily improve the efficiency of light extraction to outside.

Figure 36:
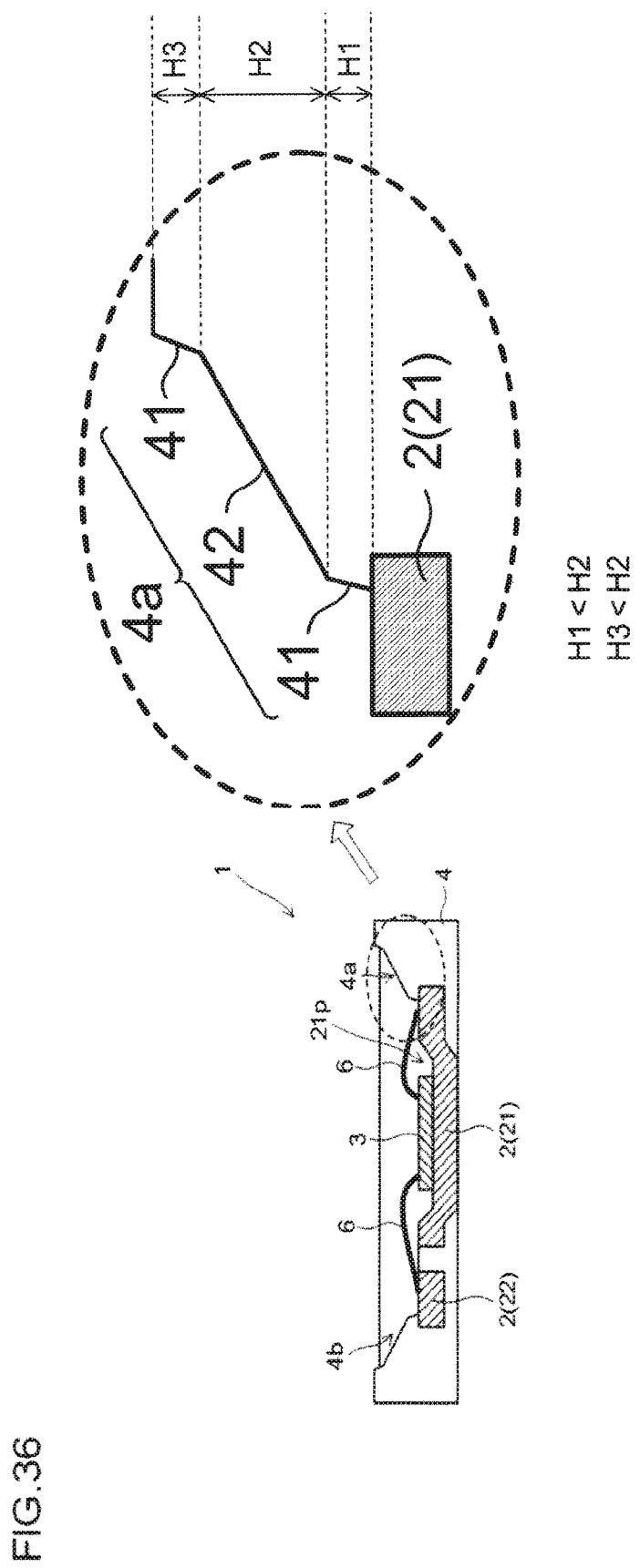
FIG. 36 is a sectional view showing still another structure of the LED package, and is a sectional view across a sectional plane perpendicular to the shorter-side direction thereof.

FIG. 36 is a sectional view showing still another structure of the LED package 1, and is a sectional view across a sectional plane perpendicular to the shorter-side direction of the LED package 1. As shown there in a part enclosed by a broken line, the resin reflective face 4a of the reflector 4 can include, as part of it, a steep inclined face 41. That is, the resin reflective face 4a can comprise a resin inclined face 42 with an inclination angle θs1 and a steep inclined face 41 with an inclination angle larger than that of the inclined face 42. Any number of steep inclined faces 41 can be provided; that is, the number of steep inclined faces 41 can be one, or two as in FIG. 36, or more. In these cases, by fulfilling formula (1) noted above for, in the resin reflective face 4a, the resin inclined face 42 excluding the steep inclined face 41, it is possible to improve light extraction efficiency. That is, formula (1) has only to be fulfilled for at least part of the resin reflective face 4a.

Figure 37A:
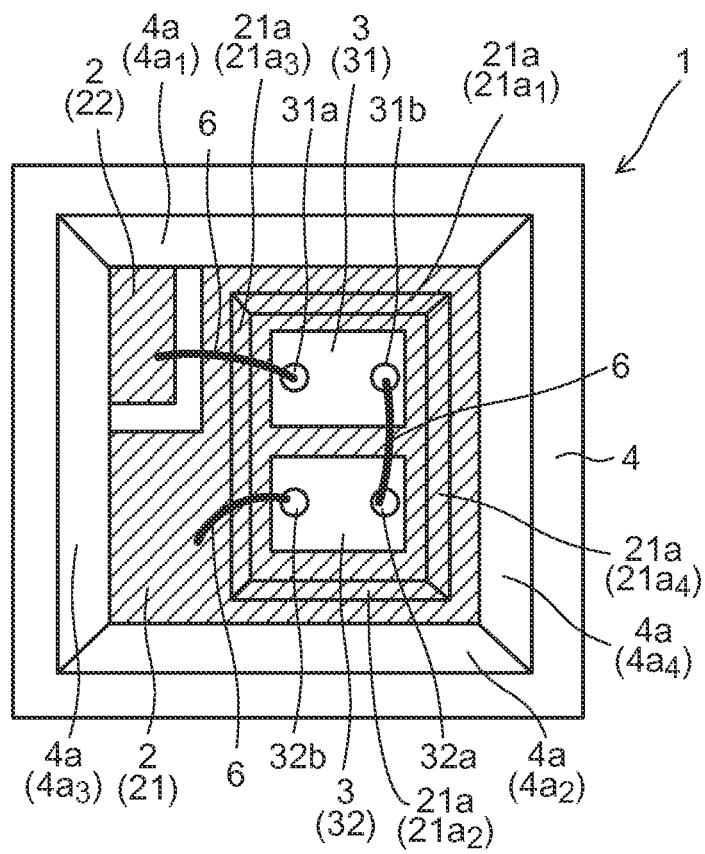
FIG. 37A is a plan view showing still another structure of the LED package.
Figure 37B:
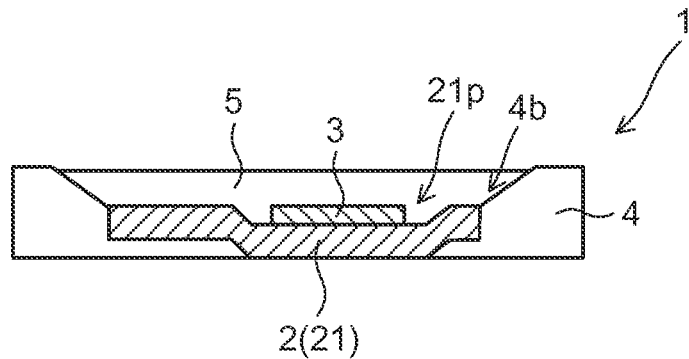
FIG. 37B is a sectional view of the LED package.
Figure 37C:
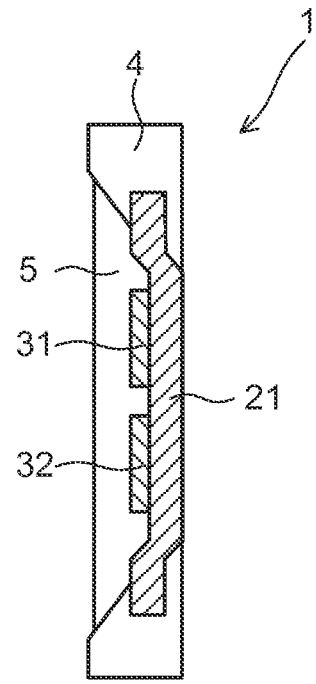
FIG. 37C is a sectional view of the LED package across a different sectional plane than FIG. 37B.

FIG. 37A is a plan view showing still another structure of the LED package 1, and FIGS. 37B and 37C are sectional views of the LED package 1 across different sectional planes thereof. As shown there, the LED package 1 can be formed to be square in shape as seen in a plan view. The shape of the metal lead frames 21 and 22 can be determined according to the shape of the LED package 1 as seen in a plan view. That is, the shape of the metal lead frames 21 and 22 can be determined such that, when arranged apart from each other, they together define a square as seen in a plan view.

Figure 38A:
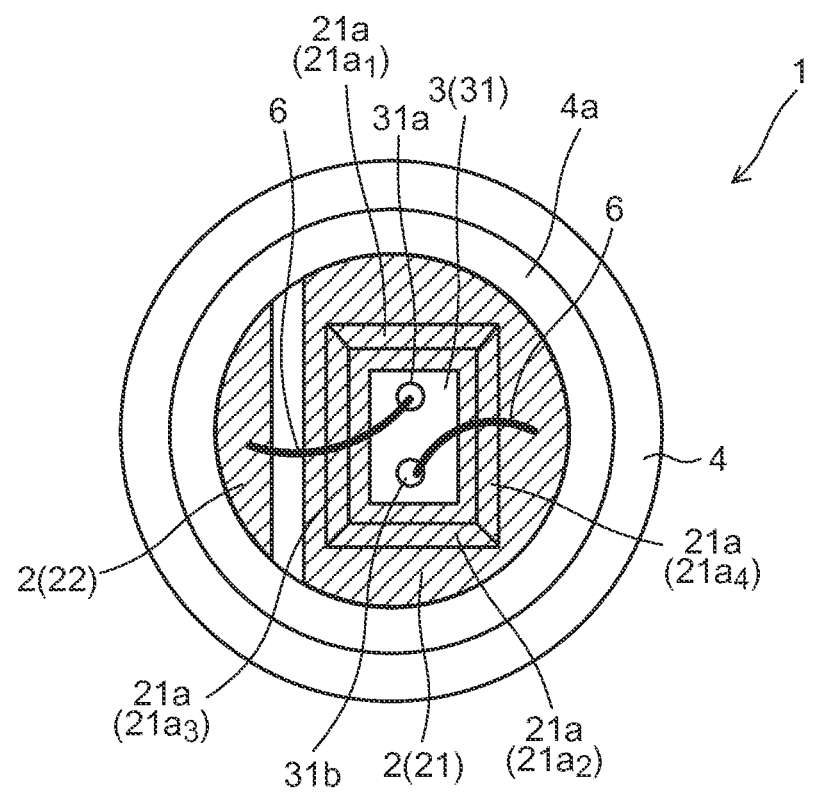
FIG. 38A is a plan view showing still another structure of the LED package.
Figure 38B:
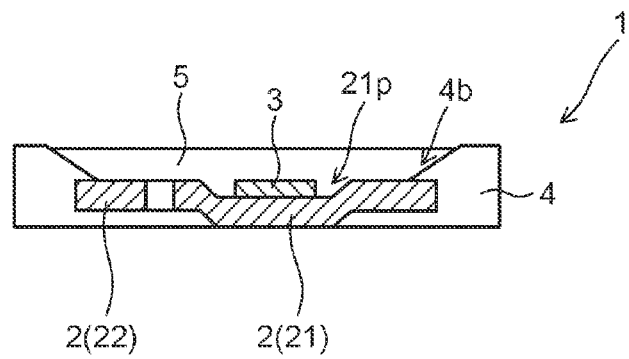
FIG. 38B is a sectional view of the LED package.

FIG. 38A is a plan view showing still another structure of the LED package 1, and FIG. 38B is a sectional view of the LED package 1. As shown there, the LED package 1 can be formed to be circular in shape as seen in a plan view. The shape of the metal lead frames 21 and 22 can be determined according to the shape of the LED package 1 as seen in a plan view. That is, the shape of the metal lead frames 21 and 22 can be determined such that, when arranged apart from each other, they together define a circle as seen in a plan view. In a case where the LED package 1 is circular as seen in a plan view, the resin reflective face 4a comprises a resin inclined face that extends continuously in the direction along the circumference of the package.

Also with the structures shown in FIGS. 37 and 38, it is possible, by arranging the LED chip 31 inside a recess 21p in the metal lead frame 21, to suppress discoloration of the inner wall of the reflector 4 and prolong the lifetime of the package, and simultaneously, by fulfilling formulae (1) and (2) for the resin inclined face and the metal reflective face which fulfill θs1<θs2, to satisfactorily improve the efficiency of light extraction to outside.

The effect of improving light extraction efficiency in the package described above depends greatly on various factors such as the size of the actual package, the reflection properties of the actually used reflector resin and metal frame, the index of refraction of the sealing resin, whether a phosphor is contained or not, and the size and characteristics of the chip. In general, an improvement of about 4% to 12% is expected. In cases where the actually used reflector resin and metal frame have especially low reflectance, a higher improvement, for example over the just-mentioned 12%, may be achieved.

[Applications of the Light-Emitting Device]

Figure 39:
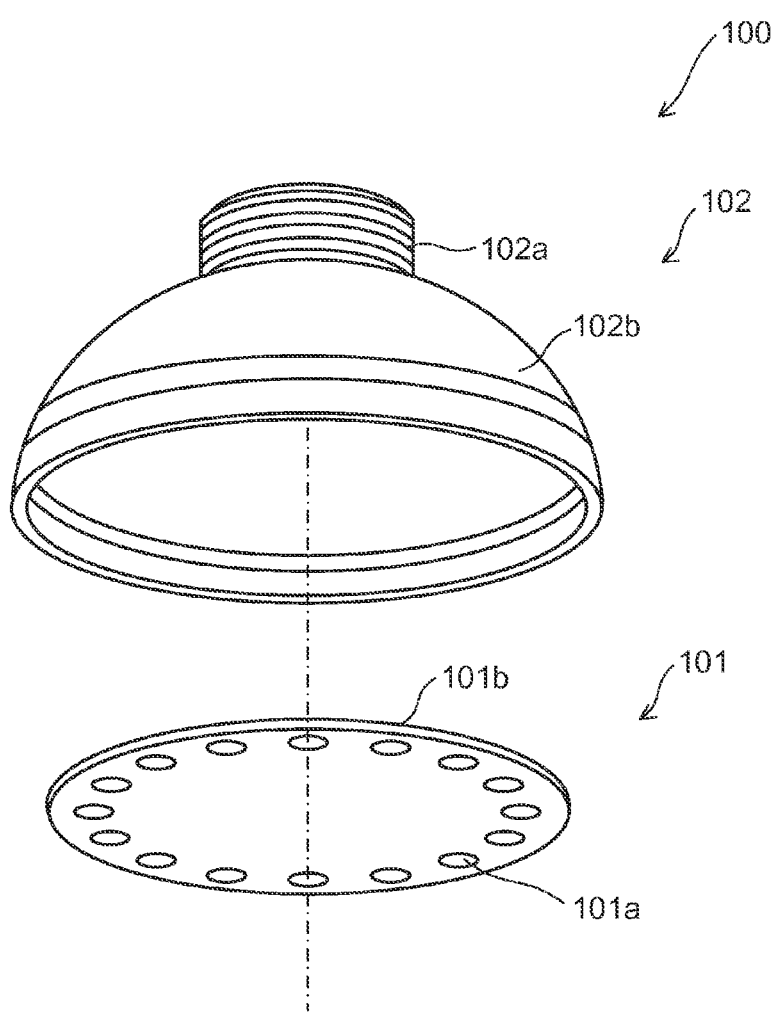
FIG. 39 is an exploded perspective view showing an outline of the structure of an illumination device to which the LED package is applied.

FIG. 39 is an exploded perspective view showing an outline of the structure of an illumination device 100 as an application example of the LED package 1 according to the embodiment. The illumination device 100 is, for example, installed indoors or outdoors for illumination of an illumination target (for example, a space or a person), and includes a light source 101 which projects light and a housing 102 in which the light source 101 is housed. The illumination device 100 can also include a heat radiator for rejecting the heat of the light source 101.

The light source 101 is composed of a plurality of LED packages 101a arranged in a ring form on a base 102b, and is fixed to the housing 102 by an unillustrated holder. Each of the LED packages 101a comprises the LED package 1 of the embodiment described previously.

The housing 102 has a socket coupler 102a which is coupled to an electricity socket (unillustrated) and a body 102 which is contiguous with the socket coupler 102a and which houses the light source 101.

Figure 40:
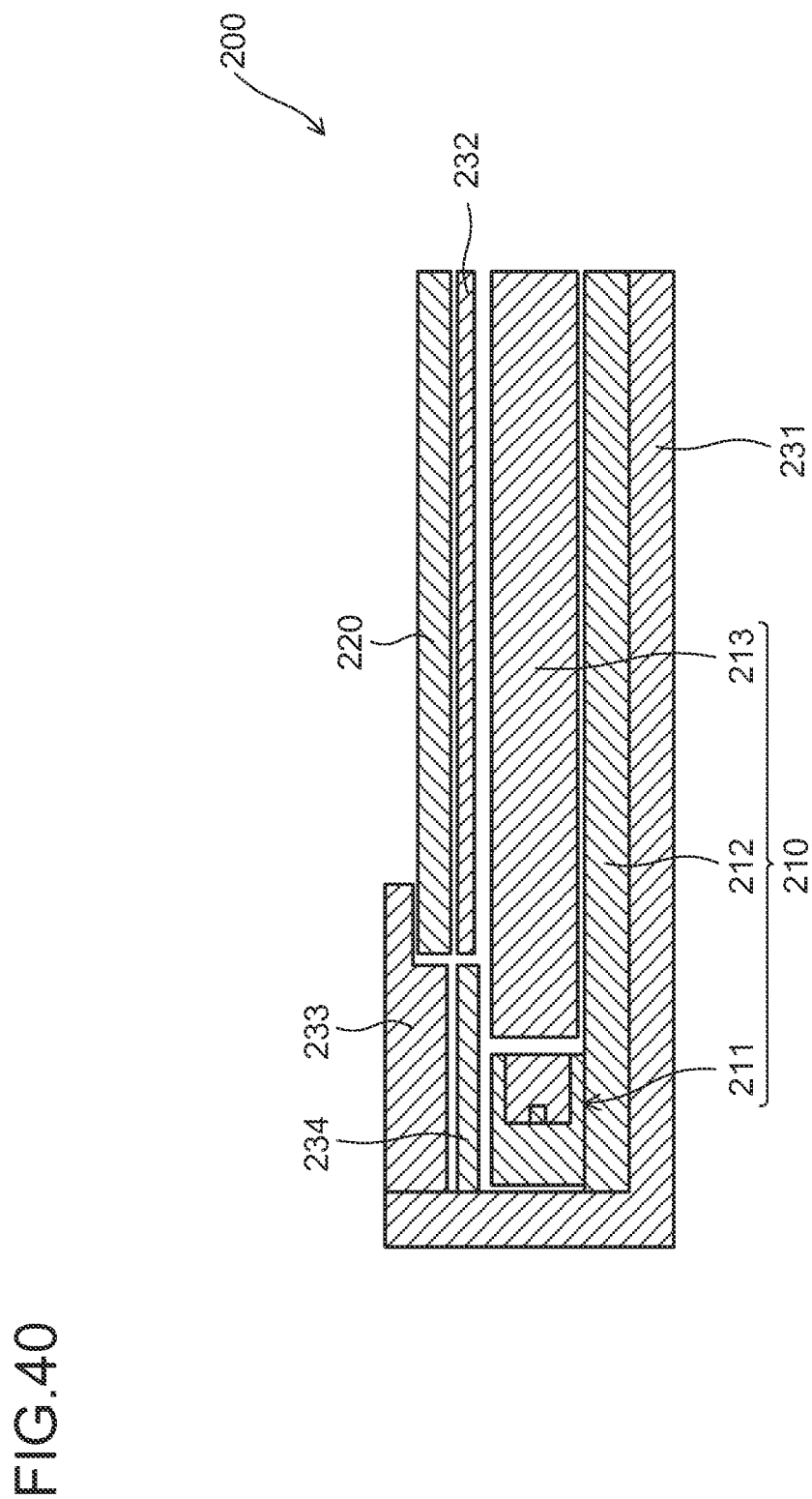
FIG. 40 is a sectional view showing an outline of the structure of a liquid crystal display device provided with a backlight for a display device to which the LED package is applied.

FIG. 40 is sectional view showing an outline of the structure of a liquid crystal display device 200 provided with a backlight 210 for display devices as another application example of the LED package 1 of the embodiment. The liquid crystal display device 200 has a backlight 210 and a liquid crystal panel 220.

The backlight 210 has an LED package 211, a mounting circuit board 212, and a light guide plate 213. The LED package 211 comprises the LED package 1 of the embodiment described previously, and is so mounted on the mounting circuit board 212 as to permit light to strike an end face of the light guide plate 213 which is arranged parallel to the mounting circuit board 212. The mounting circuit board 212 is supported on a device casing 231. The light from the LED package 211 enters the light guide plate 213 through the end face thereof and is guided therethrough so that the light eventually exits from the light guide plate 213 through a top face thereof so as to illuminate the liquid crystal panel 220 through an optical sheet 232. The liquid crystal panel 220 can, by modulating the light emergent from the light guide plate 213 according to image data, display an image. The liquid crystal panel 220 is fixed to the device casing 231 by a frame 233 which is arranged to face the LED package 211 across a reflective sheet 234.

With the LED package 1 according to the embodiment, even in cases where a high-luminance blue LED is used, it is possible to suppress deterioration of white resin, to reduce a lowering in light output, and to prolong the lifetime of the package, and it is also possible to improve the efficiency of light extraction to outside. Accordingly, by applying this LED package 1 to an illumination device 100 or to a backlight 210 in a liquid crystal display device 200, it is possible to realize an illumination device 100 and a backlight 210 that offer high luminance combined with a long lifetime.

Needless to say, it is also possible to build an LED package 1 by appropriately combining together features from different structures described with reference to the respective drawings above, and to apply it to a backlight or an illumination device.

A light-emitting device, an illumination device, and a backlight for a display device according to the embodiment can be expressed as follows.

According to one embodiment of the present invention, a light-emitting device is provided with: a light-emitting element arranged on one of a plurality of metal lead frames arranged apart from one another; and a reflector arranged so as to surround the plurality of metal lead frames together and formed of a light-reflecting resin. The light-emitting element has electrodes of different polarities electrically connected respectively to different ones of the metal lead frames, and the light-emitting element is located inside the reflector and sealed in a light-transmitting resin. In this light-emitting device, the light-emitting element is arranged inside a recess formed by bending the metal lead frame. The reflector has a resin reflective face located outside the recess in the metal lead frame and inclined relative to a bottom face of the recess. The recess in the metal lead frame has, as metal reflective faces, a plurality of side faces inclined relative to the bottom face. When the inclination angle of at least one of the metal reflective faces relative to the bottom face equals θs2 (°), then the resin reflective face has a resin inclined face inclined relative to the bottom face at an inclination angle θs1 (°) smaller than the inclination angle θs2. When the critical angle of light emergent from the light-emitting element and incident on the interface between the light-transmitting resin and the layer of air equals θc (°), then, for any of the resin inclined face and the metal reflective faces that fulfill θs1<θs2, formulae (1) and (2) below are simultaneously fulfilled:

$$45°−θc/2<θs1<θc, \quad (1)$$

$$35°≤θs2≤55°. \quad (2)$$

In a case where the light-emitting device as a whole is quadrangular in shape as seen in a plan view, the resin reflective face can comprise four resin reflective faces arranged respectively along the four sides of the quadrangle. In a case where the light-emitting device as a whole is circular in shape as seen in a plan view, the resin reflective face can comprise a continuous reflective face arranged along the circumference of the circle.

Owing to the light-emitting element being arranged inside the recess formed by bending the metal lead frame, the light emergent sideways from the light-emitting element can be reflected on the side faces (metal reflective faces) of the recess to exit frontward. Thus, it is possible to reduce the amount of light that is incident from the light-emitting element on the reflector (light-reflecting resin) directly across a short distance, to suppress discoloration of the inner wall of the reflector, and to prolong the lifetime of the device.

In a structure where the inclination angle θs1 of the resin inclined face that the resin reflective face of the reflector has is smaller than the inclination angle θs2 of the metal reflective faces of the recess in the metal lead frame, the closer to 90° the angle of incidence of the light incident on the interface between the resin and the layer of air, the more likely the light that is totally reflected on the interface, is then reflected on the resin inclined face, and is then incident on the interface again is totally reflected there, leading to lower light extraction efficiency. However, by fulfilling formula (1), that is, by setting the inclination angle θs1 of the resin inclined face larger than 45°−θc/2 but smaller than θc, it is possible to extract to outside the light that is totally reflected on the interface, is then reflected on the resin inclined face, and is then incident on the interface again without total reflection on the interface, and it is thus possible to improve light extraction efficiency.

Moreover, by fulfilling formula (2), that is, by setting the inclination angle θs2 of the metal reflective faces within the range of 45°±10°, it is possible to reflect the light emergent sideways from the light-emitting element on the metal reflective faces so that it is incident on the interface approximately perpendicularly thereto. It is thus possible to extract light to outside without total reflection on the interface.

That is, it is possible, by arranging the light-emitting element inside the recess in the metal lead frame, to suppress discoloration of the inner wall of the reflector and prolong the lifetime of the device, and simultaneously, by fulfilling formulae (1) and (2), to satisfactorily improve the efficiency of light extraction to outside.

In the above structure, preferably, the inclination angle θs1 of the resin inclined face fulfills $$\theta s1 = 22.5° + \theta c/4.$$

The inclination angle θs1 of the resin inclined face then equals the mid value between the upper and lower limits of formula (1), and thus it is possible to improve light extraction efficiency with an amply margined design where the inclination angle θs1 is away from both the upper and lower limits In the light-emitting device structured as described above, preferably, formula (3) below is further fulfilled:

$$D > 2 \cdot d \cdot \tan \theta c \quad (3)$$

where

D represents the minimum width (mm) of the opening where the interface between the light-transmitting resin and the layer of air is located in the reflector, as measured in a cross section passing through the light-emitting element; and d represents the distance (mm) from the top face of the light-emitting element to the interface between the light-transmitting resin and the layer of air.

When formula (3) is fulfilled, the light emergent from the center of the top face of the light-emitting element includes light that is incident on the interface between the light-transmitting resin and the layer of air at angles of incidence equal to or larger than the critical angle and is totally reflected there. Thus, the above-described structure according to the present invention, which improves the efficiency of light extraction from the interface to outside, is extremely effective.

The depth of the recess in the metal lead frame can be equal to or greater than the thickness of the light-emitting element. It is then possible to reflect most of the light emergent sideways from the light-emitting element on the side faces of the recess so that it is not directly incident on the reflector. It is thus possible to reliably suppress deterioration of the inner wall of the reflector.

In the light-emitting device described above, preferably, the light-emitting device is rectangular in shape as seen in a plan view; the resin inclined face comprises resin inclined faces provided opposite each other across the recess along the longer-side direction of the light-emitting device and resin inclined faces provided opposite each other across the recess along the shorter-side direction of the light-emitting device; the metal reflective faces comprise metal reflective faces provided opposite each other across the bottom face along the longer-side direction and metal reflective faces provided opposite each other across the bottom face along the shorter-side direction; each of the four resin inclined faces fulfills θs1<θs2 with respect to each of the four metal reflective faces; formula (1) is fulfilled for each of the four resin inclined faces; and formula (2) is fulfilled for each of the four metal reflective faces.

In a case where the light-emitting device is rectangular in shape as seen in a plan view, by fulfilling formula (1) for each of the four resin inclined faces of the reflector and fulfilling formula (2) for each of the four metal reflective faces of the metal lead frame, it is possible to maximize the effect of improving light extraction efficiency in the light-emitting device.

In the light-emitting device described above, preferably, the light-emitting device is rectangular in shape as seen in a plan view; the resin inclined face comprises resin inclined faces provided opposite each other across the recess along the longer-side direction of the light-emitting device and resin inclined faces provided opposite each other across the recess along the shorter-side direction of the light-emitting device; the metal reflective faces comprise metal reflective faces provided opposite each other across the bottom face along the longer-side direction and metal reflective faces provided opposite each other across the bottom face along the shorter-side direction; each of the four resin inclined faces fulfills θs1<θs2 with respect to two of the four metal reflective faces located along the longer-side direction; formula (1) is fulfilled for each of the four resin inclined faces; and formula (2) is fulfilled for the two metal reflective faces located along the longer-side direction.

By fulfilling formula (1) for each of the four resin inclined faces, it is possible to improve the efficiency of extraction of the light that is reflected on those resin inclined faces and is then incident on the interface again.

Among the four metal reflective faces of the recess in the metal lead frame, the two metal reflective faces located along the longer-side direction of the light-emitting device have a larger area than the two metal reflective faces located along the shorter-side direction, and receive more light from the LED. Thus, by fulfilling formula (2) for the two metal reflective faces located along the longer-side direction, it is possible to efficiently extract the light that is emergent sideways from the light-emitting element and is incident on the interface via the metal reflective faces.

In the light-emitting device described above, preferably, the light-emitting device is rectangular in shape as seen in a plan view; the resin inclined face comprises resin inclined faces provided opposite each other across the recess along the longer-side direction of the light-emitting device and resin inclined faces provided opposite each other across the recess along the shorter-side direction of the light-emitting device; the metal reflective faces comprise metal reflective faces provided opposite each other across the bottom face along the longer-side direction and metal reflective faces provided opposite each other across the bottom face along the shorter-side direction; each of two of the four resin inclined faces located along the shorter-side direction fulfills θs1<θs2 with respect to two of the four metal reflective faces located along the longer-side direction; formula (1) is fulfilled for the two resin inclined faces located along the shorter-side direction; and formula (2) is fulfilled for the two metal reflective faces located along the longer-side direction.

Among the four metal reflective faces of the recess in the metal lead frame, the two metal reflective faces located along the longer-side direction of the light-emitting device have a larger area than the two metal reflective faces located along the shorter-side direction, and receive more light from the LED. Thus, by fulfilling formula (2) for the two metal reflective faces located along the longer-side direction, it is possible to efficiently extract the light that is emergent sideways from the light-emitting element and is incident on the interface via the metal reflective faces.

For example, in a case where the light-emitting device according to the present invention is applied to a flat edge-lit backlight employing a light guide plate, it is necessary to reduce the dimension of the light-emitting device in the shorter-side direction, which corresponds to the thickness direction of the light guide plate. In that case, it is easier to design such that the inclination angle $\theta s1$ is smaller than the inclination angle $\theta s2$ for the two resin inclined faces located along the shorter-side direction of the light-emitting device than for the two resin inclined faces located along the longer-side direction (the direction in which the inclination angle of the two resin inclined faces located along the longer-side direction is reduced corresponds to the direction in which the dimension of the light-emitting device in the shorter-side direction is increased). Thus, by fulfilling formula (1) for the two resin inclined faces located along the shorter-side direction of the light-emitting device, it is possible, even in a case where the dimension of the light-emitting device in the shorter-side direction is reduced to couple with a flat backlight, to improve light extraction efficiency.

In the light-emitting device described above, preferably, the light-emitting device is rectangular in shape as seen in a plan view; the resin inclined face comprises resin inclined faces provided opposite each other across the recess along the longer-side direction of the light-emitting device and resin inclined faces provided opposite each other across the recess along the shorter-side direction of the light-emitting device; the metal reflective faces comprise metal reflective faces provided opposite each other across the bottom face along the longer-side direction and metal reflective faces provided opposite each other across the bottom face along the shorter-side direction; each of two of the four resin inclined faces located along the longer-side direction fulfills $\theta s1 < \theta s2$ with respect to two of the four metal reflective faces located along the longer-side direction; formula (1) is fulfilled for the two resin inclined faces located along the longer-side direction; and formula (2) is fulfilled for the two metal reflective faces located along the longer-side direction.

Among the four resin inclined faces, the two resin inclined faces located along the longer-side direction of the light-emitting device have a larger area than the two resin inclined faces located along the shorter-side direction, and thus receive more of the light that is emergent from the light-emitting element and is totally reflected on the interface. Thus, by fulfilling formula (1) for the two resin inclined faces located along the longer-side direction, it is possible to efficiently extract the light that is incident on the interface again.

Moreover, the two metal reflective faces located along the longer-side direction of the light-emitting device have a larger area than the two metal reflective faces located along the shorter-side direction, and thus receives more of the light that is emergent sideways from the LED. Thus, by fulfilling formula (2) for those two metal reflective faces, it is possible to efficiently extract the above-mentioned light.

In the above structure, the light-emitting element can comprise a plurality of light-emitting elements arranged inside the recess side by side in the longer-side direction of the light-emitting device. Arranging a plurality of light-emitting elements in such a way tends to increase, in the longer-side direction of the light-emitting device, the light that is incident on the interface at angles of incidence larger than the critical angle, leading to lower efficiency of light extraction from the interface. Thus, the present invention, which improves light extraction efficiency, is extremely effective in such a structure where a plurality of light-emitting elements are arranged side by side in the longer-side direction.

The light-transmitting resin can contain a phosphor. In that case, by using, as the light-emitting element, an LED that emits blue light and, as the phosphor, a substance that absorbs blue light and emits yellow light, it is possible to realize a light-emitting device that emits white light by mixing blue and yellow light.

According to another embodiment of the present invention, an illumination device can incorporate a light-emitting device as described above for illuminating an illumination target. It is thus possible to realize an illumination device that offers high luminance combined with a long lifetime.

According to yet another embodiment of the present invention, a backlight for a display device can incorporate a light-emitting device as described above and a light guide plate for guiding therethrough the light from the light-emitting device to illuminate a liquid crystal display panel. It is thus possible to realize a backlight for a display device that offers high luminance combined with a long lifetime.

INDUSTRIAL APPLICABILITY

Light-emitting devices according to the present invention find applications, for example, in illumination devices and in backlights for display devices.

LIST OF REFERENCE SIGNS

1 LED module (light-emitting device)
2 metal lead frame
3 LED chip (light-emitting device)
4 reflector
4a resin reflective face
$4a_1$ resin inclined face
$4a_2$ resin inclined face
$4a_3$ resin inclined face
$4a_4$ resin inclined face
5 light-transmitting resin
21 metal lead frame
21a metal reflective face
$21a_1$ metal reflective face
$21a_2$ metal reflective face
$21a_3$ metal reflective face
$21a_4$ metal reflective face
21m bottom face
21p recess
23p recess
22 metal lead frame
23 metal lead frame
31 LED chip (light-emitting element)
31a first electrode
31b second electrode 32 LED chip (light-emitting element)
32a first electrode
32b second electrode
42 resin inclined face
100 illumination device
210 backlight
213 light guide plate
220 liquid crystal panel
B interface

The invention claimed is:

1. A light-emitting device comprising:
a light-emitting element arranged on one of a plurality of metal lead frames arranged apart from one another; and
a reflector arranged so as to surround the plurality of metal lead frames together, the reflector being formed of a light-reflecting resin,
the light-emitting element comprising electrodes of different polarities electrically connected respectively to different ones of the metal lead frames,
the light-emitting element being located inside the reflector and sealed in a light-transmitting resin,
wherein
the light-emitting element is arranged inside a recess formed by bending the metal lead frame,
the reflector comprises a resin reflective face located outside the recess in the metal lead frame, the resin reflective face comprising:
a resin inclined face which is inclined relative to a bottom face of the recess,
two steep inclined faces that have a larger inclination angle than the resin inclined face, the resin inclined face being located between the two steep inclined faces whereby the resin reflective face is formed by directly connecting the resin inclined face and the two steep inclined faces, the two steep inclined faces being greater than ninety degrees;
wherein the resin reflective face is formed by directly connecting together a total of only three faces which are the resin inclined face and the two steep inclined faces;
wherein the resin inclined face and the two steep inclined faces all make contact with the light-transmitting resin in which the light-emitting element is sealed;
the recess in the metal lead frame comprises, as metal reflective faces, a plurality of side faces inclined relative to the bottom face,
when an inclination angle of at least one of the metal reflective faces relative to the bottom face equals $\theta s2$ (°), then the resin reflective face comprises a resin inclined face inclined relative to the bottom face at an inclination angle $\theta s1$ (°) smaller than the inclination angle $\theta s2$,
an interface between the light-transmitting resin and a layer of air is a flat face that is parallel to the bottom face of the recess, and
when a critical angle of light emergent from the light-emitting element and incident on an interface between the light-transmitting resin and a layer of air equals $\theta c$ (°), then, for any of the resin inclined face and the metal reflective faces that fulfill $\theta s1 < \theta s2$, formulae (1) and (2) below are simultaneously fulfilled:

$$45° - \theta c/2 < \theta s1 < \theta c, \qquad (1)$$

$$35° \leq \theta s2 \leq 55°, \qquad (2)$$

the light-emitting device is rectangular in shape as seen in a plan view,
the resin inclined face comprises
resin inclined faces provided opposite each other across the recess along a longer-side direction of the light-emitting device and
resin inclined faces provided opposite each other across the recess along a shorter-side direction of the light-emitting device,
the metal reflective faces comprise
metal reflective faces provided opposite each other across the bottom face along the longer-side direction and
metal reflective faces provided opposite each other across the bottom face along the shorter-side direction,
each of the four resin inclined faces fulfills $\theta s1 < \theta s2$ with respect to two of the four metal reflective faces located along the longer-side direction,
formula (1) is fulfilled for each of the four resin inclined faces, and
formula (2) is fulfilled for the two metal reflective faces located along the longer-side direction.

2. The light-emitting device according to claim 1, wherein the inclination angle $\theta s1$ of the resin inclined face fulfills $$\theta s1 = 22.5° + \theta c/4.$$

3. The light-emitting device according to claim 1, wherein formula (3) below is further fulfilled:

$$D > 2 \cdot d \cdot \tan \theta c \qquad (3)$$

where
D represents a minimum width (mm) of an opening where the interface between the light-transmitting resin and the layer of air is located in the reflector, as measured in a cross section passing through the light-emitting element; and
d represents a distance (mm) from a top face of the light-emitting element to the interface between the light-transmitting resin and the layer of air.

4. The light-emitting device according to claim 1, wherein a depth of the recess in the metal lead frame is equal to or greater than a thickness of the light-emitting element.

5. The light-emitting device according to claim 1, wherein the light-emitting element comprises a plurality of light-emitting elements arranged inside the recess side by side in the longer-side direction of the light-emitting device.

6. The light-emitting device according to claim 1, wherein the light-transmitting resin comprises a phosphor.

7. An illumination device comprising the light-emitting device according to claim 1 for illuminating an illumination target.

8. A backlight for a display device, comprising:
the light-emitting device according to claim 1; and
a light guide plate configured to guide therethrough light from the light-emitting device to illuminate a liquid crystal display panel.

9. The light-emitting device according to claim 1, wherein an upper limit and a lower limit of $\theta s1$ in formula (1) varies with an index of refraction of the light-transmitting resin.

10. The light-emitting device according to claim 1, wherein the metal reflective faces and the resin inclined face are each a flat face.

11. The light-emitting device according to claim 1, wherein the resin inclined face and the two steep inclined faces are located between a topmost face of a metal lead frame located in a topmost part inside the reflector and a topmost face of the reflector.

12. The light-emitting device according to claim 1, wherein the resin inclined face and the two steep inclined faces are connected together such that, in the direction perpendicular to the bottom face of the recess, the height of the resin inclined face is greater than the height of the steep inclined face on one side and is greater than the height of the steep inclined face on the other side.

13. A light-emitting device comprising:
a light-emitting element arranged on one of a plurality of metal lead frames arranged apart from one another; and
a reflector arranged so as to surround the plurality of metal lead frames together, the reflector being formed of a light-reflecting resin,
the light-emitting element comprising electrodes of different polarities electrically connected respectively to different ones of the metal lead frames,
the light-emitting element being located inside the reflector and sealed in a light-transmitting resin,
wherein
the light-emitting element is arranged inside a recess formed by bending the metal lead frame,
the reflector comprises a resin reflective face located outside the recess in the metal lead frame, the resin reflective face comprising:
an resin inclined face which is inclined relative to a bottom face of the recess,
two steep inclined faces that have a larger inclination angle than the resin inclined face, the resin inclined face being located between the two steep inclined faces whereby the resin reflective face is formed by directly connecting the resin inclined face and the two steep inclined faces, the two steep inclined faces being greater than ninety degrees;
wherein the resin reflective face is formed by directly connecting together a total of only three faces which are the resin inclined face and the two steep inclined faces;
wherein the resin inclined face and the two steep inclined faces all make contact with the light-transmitting resin in which the light-emitting element is sealed; the recess in the metal lead frame comprises, as metal reflective faces, a plurality of side faces inclined relative to the bottom face,
when an inclination angle of at least one of the metal reflective faces relative to the bottom face equals $\theta s2$ (°), then the resin reflective face comprises a resin inclined face inclined relative to the bottom face at an inclination angle $\theta s1$ (°) smaller than the inclination angle $\theta s2$,
an interface between the light-transmitting resin and a layer of air is a flat face that is parallel to the bottom face of the recess, and
when a critical angle of light emergent from the light-emitting element and incident on an interface between the light-transmitting resin and a layer of air equals $\theta c$ (°), then, for any of the resin inclined face and the metal reflective faces that fulfill $\theta s1 < \theta s2$, formulae (1) and (2) below are simultaneously fulfilled:

$$45° - \theta c/2 < \theta s1 < \theta c, \quad (1)$$

$$35° \leq \theta s2 \leq 55°, \quad (2)$$

the light-emitting device is rectangular in shape as seen in a plan view, the resin inclined face comprises:
resin inclined faces provided opposite each other across the recess along a longer-side direction of the light-emitting device and
resin inclined faces provided opposite each other across the recess along a shorter-side direction of the light-emitting device,
the metal reflective faces comprise:
metal reflective faces provided opposite each other across the bottom face along the longer-side direction and
metal reflective faces provided opposite each other across the bottom face along the shorter-side direction,
each of two of the four resin inclined faces located along the shorter-side direction fulfills $\theta s1 < \theta s2$ with respect to two of the four metal reflective faces located along the longer-side direction,
formula (1) is fulfilled for the two resin inclined faces located along the shorter-side direction, and
formula (2) is fulfilled for the two metal reflective faces located along the longer-side direction.

14. The light-emitting device according to claim 13, wherein an upper limit and a lower limit of $\theta s1$ in formula (1) varies with an index of refraction of the light-transmitting resin.

15. The light-emitting device according to claim 13, wherein the metal reflective faces and the resin inclined face are each a flat face.

16. The light-emitting device according to claim 13, wherein the resin inclined face and the two steep inclined faces are located between a topmost face of a metal lead frame located in a topmost part inside the reflector and a topmost face of the reflector.

17. The light-emitting device according to claim 13, wherein the resin inclined face and the two steep inclined faces are connected together such that, in the direction perpendicular to the bottom face of the recess, the height of the resin inclined face is greater than the height of the steep inclined face on one side and is greater than the height of the steep inclined face on the other side.

18. A light-emitting device comprising:
a light-emitting element arranged on one of a plurality of metal lead frames arranged apart from one another; and
a reflector arranged so as to surround the plurality of metal lead frames together, the reflector being formed of a light-reflecting resin,
the light-emitting element comprising electrodes of different polarities electrically connected respectively to different ones of the metal lead frames,
the light-emitting element being located inside the reflector and sealed in a light-transmitting resin,
wherein
the light-emitting element is arranged inside a recess formed by bending the metal lead frame,
the reflector comprises a resin reflective face located outside the recess in the metal lead frame, the resin reflective face comprising:
a resin inclined face which is inclined relative to a bottom face of the recess,
two steep inclined faces that have a larger inclination angle than the resin inclined face, the resin inclined face being located between the two steep inclined faces whereby the resin reflective face is formed by directly connecting the resin inclined face and the two steep inclined faces, the two steep inclined faces being greater than ninety degrees;

wherein the rein reflective face is formed by directly connecting together a total of only three faces which are the resin inclined face and the two steep inclined faces;

wherein the resin inclined face and the two steep inclined faces all make contact with the light-transmitting resin in which the light-emitting element is sealed; the recess in the metal lead frame comprises, as metal reflective faces, a plurality of side faces inclined relative to the bottom face, when an inclination angle of at least one of the metal reflective faces relative to the bottom face equals $\theta s2$ (°), then the resin reflective face comprises a resin inclined face inclined relative to the bottom face at an inclination angle $\theta s1$ (°) smaller than the inclination angle $\theta s2$, an interface between the light-transmitting resin and a layer of air is a flat face that is parallel to the bottom face of the recess, and when a critical angle of light emergent from the light-emitting element and incident on an interface between the light-transmitting resin and a layer of air equals $\theta c$ (°), then, for any of the resin inclined face and the metal reflective faces that fulfill $\theta s1 < \theta s2$, formulae (1) and (2) below are simultaneously fulfilled:

$$45° - \theta c/2 < \theta s1 < \theta c, \tag{1}$$

$$35° \leq \theta s2 \leq 55°, \tag{2}$$

the light-emitting device is rectangular in shape as seen in a plan view, the resin inclined face comprises:
  resin inclined faces provided opposite each other across the recess along a longer-side direction of the light-emitting device and
  resin inclined faces provided opposite each other across the recess along a shorter-side direction of the light-emitting device, the metal reflective faces comprise:
  metal reflective faces provided opposite each other across the bottom face along the longer-side direction and
  metal reflective faces provided opposite each other across the bottom face along the shorter-side direction, each of two of the four resin inclined faces located along the longer-side direction fulfills $\theta s1 < \theta s2$ with respect to two of the four metal reflective faces located along the longer-side direction, formula (1) is fulfilled for the two resin inclined faces located along the longer-side direction, and formula (2) is fulfilled for the two metal reflective faces located along the longer-side direction.

19. The light-emitting device according to claim 18, wherein an upper limit and a lower limit of $\theta s1$ in formula (1) varies with an index of refraction of the light-transmitting resin.

20. The light-emitting device according to claim 18, wherein the metal reflective faces and the resin inclined face are each a flat face.

21. The light-emitting device according to claim 18, wherein the resin inclined face and the two steep inclined faces are located between a topmost face of a metal lead frame located in a topmost part inside the reflector and a topmost face of the reflector.

22. The light-emitting device according to claim 18, wherein the resin inclined face and the two steep inclined faces are connected together such that, in the direction perpendicular to the bottom face of the recess, the height of the resin inclined face is greater than the height of the steep inclined face on one side and is greater than the height of the steep inclined face on the other side.

23. A light-emitting device comprising:
  a light-emitting element arranged on one of a plurality of metal lead frames arranged apart from one another; and
  a reflector arranged so as to surround the plurality of metal lead frames together, the reflector being formed of a light-reflecting resin,
  the light-emitting element comprising electrodes of different polarities electrically connected respectively to different ones of the metal lead frames,
  the light-emitting element being located inside the reflector and sealed in a light-transmitting resin,
  wherein
  the light-emitting element is arranged inside a recess formed by bending the metal lead frame,
  the reflector comprises a resin reflective face located outside the recess in the metal lead frame, the resin reflective face comprising:
    a resin inclined face which is inclined relative to a bottom face of the recess,
    two steep inclined faces that have a larger inclination angle than the resin inclined face, the resin inclined face being located between the two steep inclined faces whereby the resin reflective face is formed by directly connecting the resin inclined face and the two steep inclined faces, the two steep inclined faces being greater than ninety degrees;
  wherein the rein reflective face is formed by directly connecting together a total of only three faces which are the resin inclined face and the two steep inclined faces;
  wherein the resin inclined face and the two steep inclined faces all make contact with the light-transmitting resin in which the light-emitting element is sealed; the recess in the metal lead frame comprises, as metal reflective faces, a plurality of side faces inclined relative to the bottom face,
  when an inclination angle of at least one of the metal reflective faces relative to the bottom face equals $\theta s2$ (°), then the resin reflective face comprises a resin inclined face inclined relative to the bottom face at an inclination angle $\theta s1$ (°) smaller than the inclination angle $\theta s2$,
  an interface between the light-transmitting resin and a layer of air is a flat face that is parallel to the bottom face of the recess, and
  when a critical angle of light emergent from the light-emitting element and incident on an interface between the light-transmitting resin and a layer of air equals $\theta c$ (°), then, for any of the resin inclined face and the metal reflective faces that fulfill $\theta s1 < \theta s2$, formula (1) below is fulfilled, and
  when an inclination angle of a direction in which intensity of light emergent from a side face of the light-emitting element relative to an axis perpendicular to the side face is maximal is represented by $\theta 0$ (°), then when $-20° \leq \theta 0 \leq 20°$, formula (2) below is fulfilled:

$$45° - \theta c/2 < \theta s1 < \theta c, \tag{1}$$

$$35° \leq \theta s2 \leq 55°. \tag{2}$$

24. The light-emitting device according to claim 23, wherein the light-emitting device is rectangular in shape as seen in a plan view, the resin inclined face comprises
resin inclined faces provided opposite each other across the recess along a longer-side direction of the light-emitting device and
resin inclined faces provided opposite each other across the recess along a shorter-side direction of the light-emitting device, the metal reflective faces comprise
metal reflective faces provided opposite each other across the bottom face along the longer-side direction and
metal reflective faces provided opposite each other across the bottom face along the shorter-side direction, each of the four resin inclined faces fulfills $\theta s1<\theta s2$ with respect to each of the four metal reflective faces, formula (1) is fulfilled for each of the four resin inclined faces, and formula (2) is fulfilled for each of the four metal reflective faces.

25. The light-emitting device according to claim 23, wherein an upper limit and a lower limit of $\theta s1$ in formula (1) varies with an index of refraction of the light-transmitting resin.

26. The light-emitting device according to claim 23, wherein the metal reflective faces and the resin inclined face are each a flat face.

27. The light-emitting device according to claim 23, wherein the resin inclined face and the two steep inclined faces are located between a topmost face of a metal lead frame located in a topmost part inside the reflector and a topmost face of the reflector.

28. The light-emitting device according to claim 23, wherein the resin inclined face and the two steep inclined faces are connected together such that, in the direction perpendicular to the bottom face of the recess, the height of the resin inclined face is greater than the height of the steep inclined face on one side and is greater than the height of the steep inclined face on the other side.

* * * * *